United States Patent
Sharma

(10) Patent No.: US 10,770,770 B2
(45) Date of Patent: Sep. 8, 2020

(54) LOW LOSS, WIDE BAND, PHASE SHIFTER UTILIZING TRANSFORMER

(71) Applicant: pSemi Corporation, San Diego, CA (US)

(72) Inventor: Vikas Sharma, Reading (GB)

(73) Assignee: pSemi Corporation, San Diego, CA (US)

( * ) Notice: Subject to any disclaimer, the term of this patent is extended or adjusted under 35 U.S.C. 154(b) by 180 days.

(21) Appl. No.: 15/855,901

(22) Filed: Dec. 27, 2017

(65) Prior Publication Data

US 2019/0198957 A1    Jun. 27, 2019

(51) Int. Cl.
| | |
|---|---|
| *H01P 1/18* | (2006.01) |
| *H03H 7/20* | (2006.01) |
| *H03H 11/22* | (2006.01) |
| *H03C 7/02* | (2006.01) |
| *H04B 1/18* | (2006.01) |
| *H03H 7/18* | (2006.01) |
| *H04B 1/04* | (2006.01) |

(52) U.S. Cl.
CPC ............. *H01P 1/184* (2013.01); *H03C 7/022* (2013.01); *H03H 7/185* (2013.01); *H03H 7/20* (2013.01); *H03H 11/22* (2013.01); *H04B 1/18* (2013.01); *H03C 2200/0033* (2013.01); *H04B 1/0458* (2013.01)

(58) Field of Classification Search
CPC ......... H01P 1/184; H04B 1/18; H04B 1/0458; H03H 7/20; H03H 7/185; H03H 11/22; H03C 7/022; H03C 2200/0033
USPC ........................ 333/24 R, 139, 156, 161, 177
See application file for complete search history.

(56) References Cited

U.S. PATENT DOCUMENTS

| | | | |
|---|---|---|---|
| 4,558,291 A * | 12/1985 | Nichols .................... | H03H 7/20 333/103 |
| 7,248,120 B2 | 7/2007 | Burgener et al. | |
| 9,831,857 B2 | 11/2017 | Facchini et al. | |
| 9,831,869 B2 | 11/2017 | Lu et al. | |
| 2017/0194688 A1 | 7/2017 | Sharma et al. | |
| 2017/0359058 A1 | 12/2017 | Bacon | |
| 2019/0020088 A1 * | 1/2019 | Huettner ................. | H01P 1/185 |

* cited by examiner

*Primary Examiner* — Robert J Pascal
*Assistant Examiner* — Jorge L Salazar, Jr.
(74) *Attorney, Agent, or Firm* — Jaquez Land Greenhaus LLP; Alessandro Steinfl, Esq.

(57) ABSTRACT

A low loss, wide band, phase shifter utilizing one or more transformers in presented. In one case, the phase shifter includes a reflective SPDT switch that is coupled to a transformer. In another case, the phase shifter includes a distributed SPDT switch that includes switchable conduction paths having series connected unit elements of a same phase shift. The transformer may be part of an existing circuit and may be reused to provide the functionality of the phase shifter by introducing the reflective or the distributed SPDT switch.

26 Claims, 21 Drawing Sheets

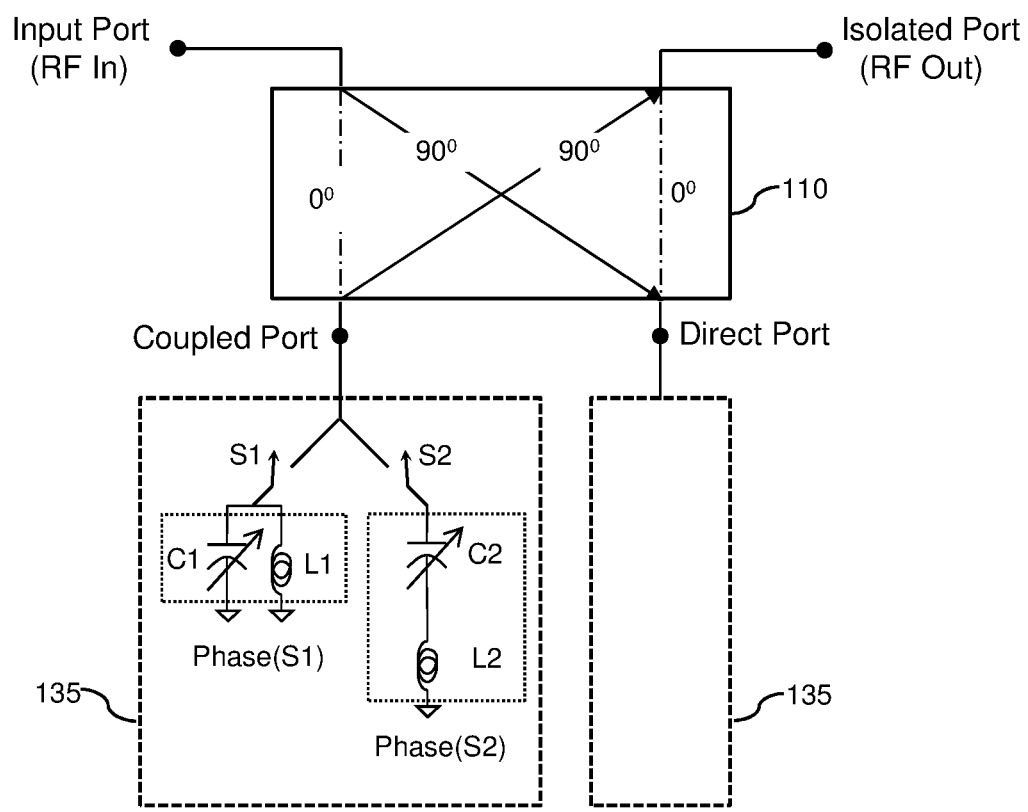
FIG. 1  *Prior Art*

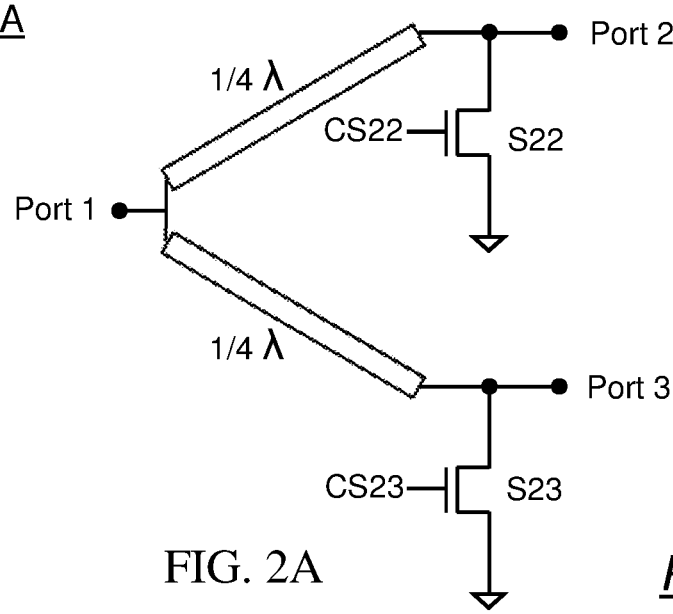
FIG. 2A  *Prior Art*
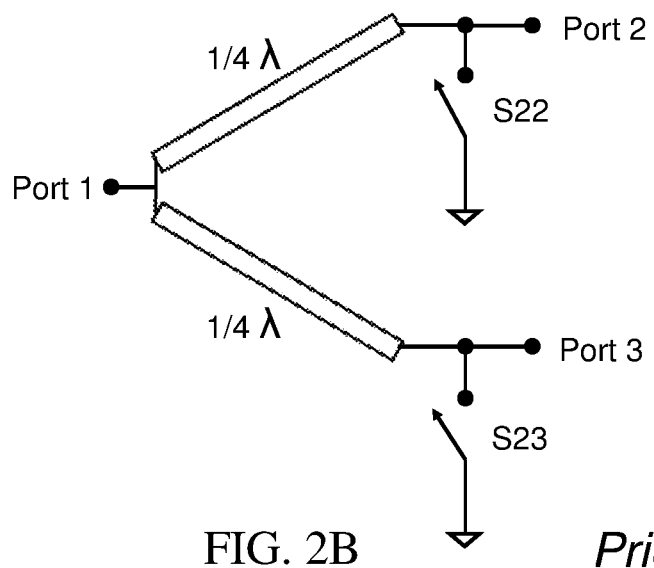
FIG. 2B  *Prior Art*

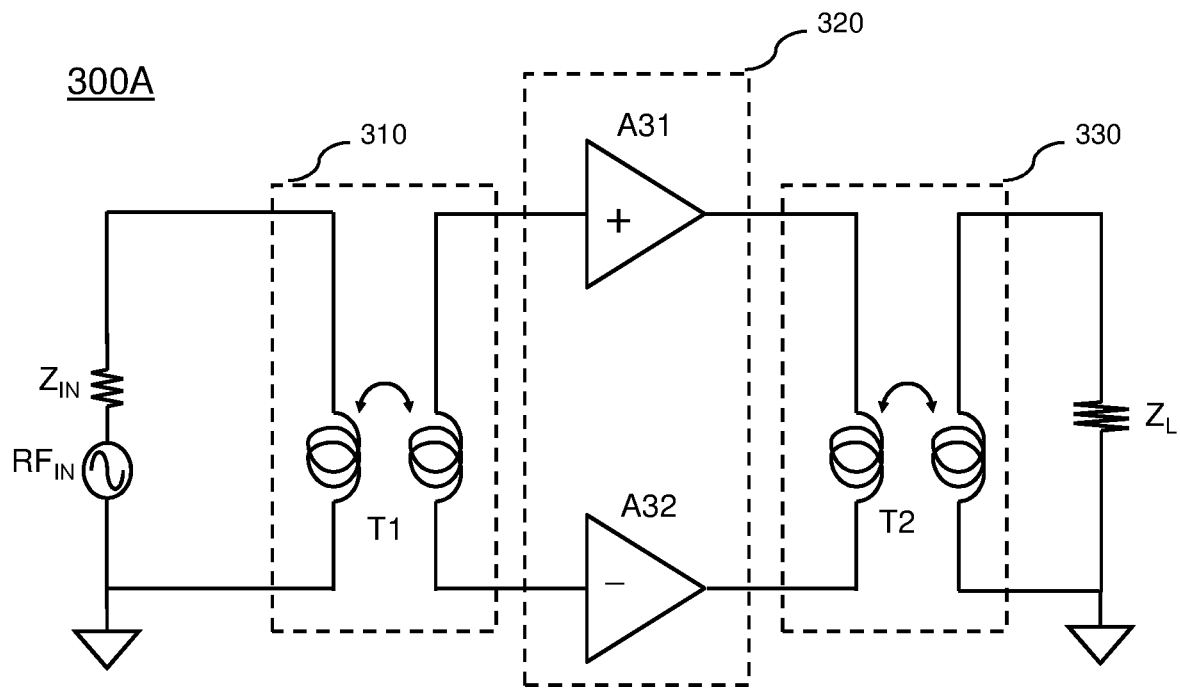
FIG. 3A  *Prior Art*
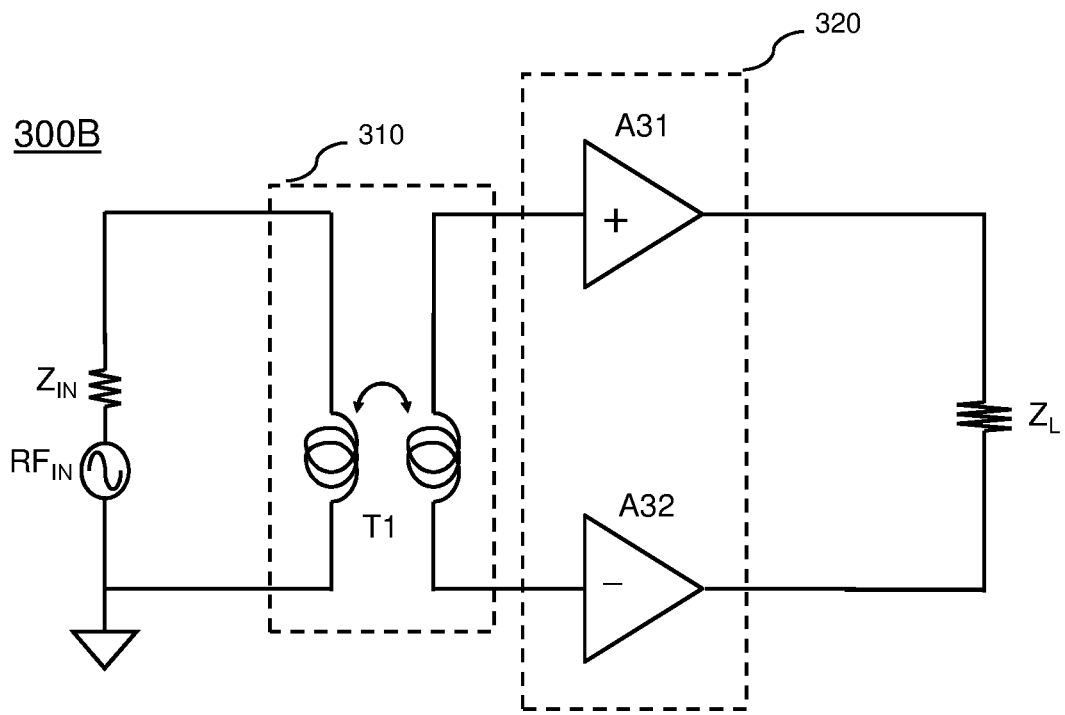
FIG. 3B  *Prior Art*

LOW LOSS, WIDE BAND, PHASE SHIFTER UTILIZING TRANSFORMER

CROSS REFERENCE TO RELATED APPLICATIONS

The present application may be related to U.S. Pat. No. 9,831,857, entitled "Power Splitter with Programmable Output Phase Shift, issued Nov. 28, 2017, the disclosure of which is incorporated herein by reference in its entirety. The present application may also be related U.S. Pat. No. 9,831,869, entitled "Radio Frequency Switching Circuit with Distributed Switches", issued Nov. 28, 2017, the disclosure of which is incorporated herein by reference in its entirety. The present application may also be related U.S. Patent Publication No. 2017/0194688 A1, entitled "Reflection-Based RF Phase Shifter", published on Jul. 6, 2017, the disclosure of which is incorporated herein by reference in its entirety. The present application may also be related U.S. Patent Publication No. US-2017-0359058-A1, entitled "Apparatus for Reducing RF Crossover Coupling", published on Dec. 14, 2017, the disclosure of which is incorporated herein by reference in its entirety.

TECHNICAL FIELD

The present teachings relate to radio frequency (RF) circuits. More particularly, the present teachings relate to methods and apparatuses for RF phase shifter circuits.

BACKGROUND

Phase Shifters are devices, in which the phase of an electromagnetic wave of a given frequency can be shifted when propagating through a transmission line. In many fields of electronics, it is often necessary to change the phase of signals. RF, microwave, and millimeter-wave (mm wave) phase shifters have many applications in various equipment, such as, for example, phase discriminators, beam forming networks, IQ vector modulators, power dividers, linearization of power amplifiers, and phased array antennas.

FIG. 1 shows one type of prior art RF phase shifter, called a reflective phase shifter (100), which uses a hybrid coupler (110), for example, a Lange coupler as known to a person skilled in the art, and a pair of reflective terminating circuits (135) coupled to a pair of ports, labelled as Coupled Port and Direct Port, of the hybrid coupler (110). The hybrid coupler (110) splits an input signal provided at an input port, Input Port, into two signals of equal power but ninety degrees, 90°, out of phase that are provided at the Coupled Port and the Direct Port. Accordingly, these signals reflect from the pair of reflecting terminating circuits (135), and combine in phase (constructively) at the phase shifter output, labelled as Isolated Port, so long as the pair of reflective terminating circuits (135) are identical in reflection coefficient (both magnitude and phase).

In some cases, as shown in FIG. 1, the pair of reflecting terminating circuits (135) can be switchable loads, to provide, for example, different phase shifts between an input RF signal at the input port, Input Port, and a shifted version of the input RF signal at the output port, Isolated Port. Switching of the loads can be provided via a pair of switches, S1, S2, which can be, for example, FET switches.

As shown in FIG. 1, the pair of reflective terminating circuits (135), each comprise reactive elements, arranged as two separate reactive loads (e.g. (L1, C1) and (L2, C2)), which are configured to provide the different phase shifts. In the exemplary case depicted in FIG. 1, when switch S1 is closed and switch S2 is open, the reactive load (L1, C1) is coupled to the Coupled Port and the Direct Port, and a phase, Phase(S1), which can be considered as a reference phase at a particular frequency, is provided at the output port, Isolated Port. On the other hand, when switch S2 is closed and switch S1 is open, the reactive load (L2, C2) is coupled to the Coupled Port and the Direct Port, and a phase, Phase(S2), at the particular frequency, is provided at the output port, Isolated port, where a relationship between the two phases, Phase(S1) and Phase(S2), is such that a phase shift, $\Delta\Phi=\text{Phase}(S1)-\text{Phase}(S2)$, is approximately equal to one hundred and eighty degrees ($\Delta\Phi=180°$) at the particular frequency. A person skilled in the art would know that in the configuration depicted in FIG. 1, the phase, Phase(S1), is considered as a reference phase. More description on such configuration, including optimization of the reactive loads for a reduced phase error of the provided phase shift, $\Delta\Phi$, can be found, for example, in the above sited reference, U.S. Patent Publication No. 2017/0194688 A1, the disclosure of which is incorporated herein by reference in its entirety.

A constant need for higher frequencies of operation of the reflective phase shifter (100) of FIG. 1 (e.g. mm wave; 30 GHz-300 GHz) may in turn push component values of the reactive loads (e.g. (L1, C1), (L2, C2)) to impractically small values. This coupled with an inherently higher insertion loss (IL), about 3 dB and higher, as well as a relatively high physical layout size, of the reflective phase shifter (100), is a motivation for the teachings according to the present disclosure.

SUMMARY

According to an aspect of the present disclosure, a phase shifter circuit is presented, the phase shifter circuit comprising: a first port configured to receive a radio frequency (RF) signal that is processed by the phase shifter circuit and output at a load; a first switchable conduction path comprising one or more series connected transmission lines, and one or more shunted switching transistors each coupled to a respective transmission line of the one or more series connected transmission lines, the first switchable conduction path configured to selectively couple the first port to a second port via one of a low impedance conduction path and a high impedance conduction path by respectively opening and closing of at least one shunted switching transistor of the one or more shunted switching transistors of the first switchable conduction path; a second switchable conduction path comprising one or more series connected transmission lines, and one or more shunted switching transistors each coupled to a respective transmission line of the one or more series connected transmission lines, the second switchable conduction path configured to selectively couple the first port to a third port via one of a low impedance conduction path and a high impedance conduction path by respectively opening and closing of at least one shunted switching transistor of the one or more shunted switching transistors of the second switchable conduction path; and a first transformer having a first winding and a second winding, the first winding coupled to the second port and the third port at a respective one of two ends of the first winding, and the second winding coupled to the load, wherein the phase shifter circuit is configured to operate according to at least two modes of operation, a first mode and a second mode, wherein in the first mode of operation, the first switchable conduction path couples the first port to the second port via the low impedance conduction path, and the second switchable conduction path couples the first port to the third port via the high impedance conduction path, and wherein in the second mode of operation, the first switchable conduction path couples the first port to the second port via the high impedance conduction path, and the second switchable conduction path couples the first port to the third port via the low impedance conduction path.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 1 shows a prior art reflective phase shifter.

FIG. 2A shows a topology of a prior art reflective SPDT switch.

FIGS. 2B, 2C and 2D show the reflective SPDT switch of FIG. 1 in different switched configurations (states).

FIG. 3A shows a prior art differential RF amplifier with impedance matching input and output transformers.

FIG. 3B shows a prior art differential RF amplifier with an impedance matching input transformer.

DETAILED DESCRIPTION

Figure 2C:
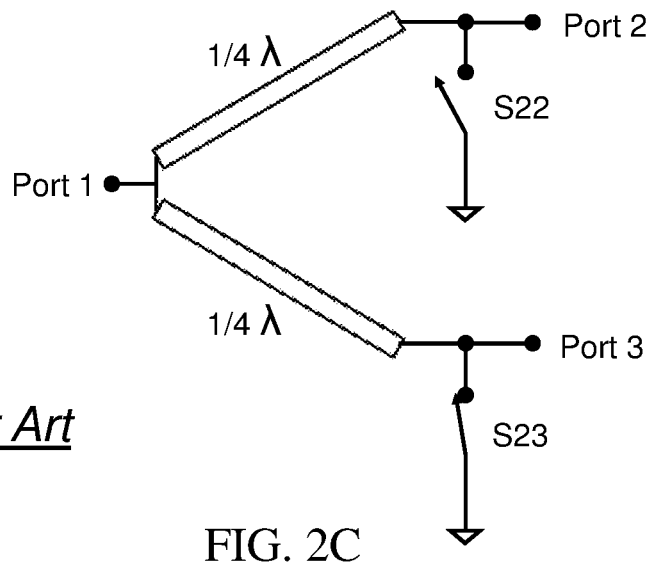

Throughout this description, embodiments and variations are described for the purpose of illustrating uses and implementations of the inventive concept. The illustrative description should be understood as presenting examples of the inventive concept, rather than as limiting the scope of the concept as disclosed herein.

Apparatus and methods that provide switchable phase shifting of RF signals with low loss (e.g. 1.5 dB to 2.0 dB) and within a wide frequency range of operation (e.g., DC to 300 GHz) of the RF signals, are presented in the present disclosure. The switchable phase shifter according to the present disclosure can provide advantages with respect to the prior art reflective phase shifter (100) of FIG. 1 discussed above, that include a lower insertion loss, a more compact physical layout, and a more robust practical implementation for higher frequency (e.g. up to 300 GHz) designs.

In some applications, a higher insertion loss of the prior art reflective phase shifter (100) of FIG. 1 may be compensated for by further amplification of an RF signal output following the phase shifter. The amplification would add to increase in power consumption as well as occupying a larger geometry, therefore increasing the overall area. A person skilled in the art would understand that amplification of the RF signal can increase a physical layout size of a corresponding design, not only by virtue of using larger device sizes, but also necessity, in some cases, to use amplification to bring up the signal to a desired minimum level. In contrast, the phase shifter according to the present disclosure may provide a reduced insertion loss which therefore may require a relatively lower level of amplification of a corresponding output signal, or in some cases, no amplification at all. In turn, such lower level of amplification or no amplification at all, can provide a reduction in a physical layout size of a design, while not adding to power consumption.

The phase shifter according to the present disclosure may not require passive reactive components, such as the capacitors and/or inductors used in the reactive loads (L1, C1), (L2, C2) of the reflective terminating circuits (135) of the prior art reflective phase shifter (100) depicted in FIG. 1. Accordingly, higher frequency designs (e.g. up to 300 GHz) can be achieved without consideration for practical implementation of precise values of the reactive components used in the prior art design. Also, lack of such reactive components may further reduce physical layout size of a design using the phase shifter according to the present disclosure.

According to one embodiment of the present disclosure, the phase shifter according to the present disclosure can take advantage of usage of a transformer in an RF application, which in combination with a pair of switchable conduction paths coupled to the transformer, can provide phase shifts that are a function of switched states of the pair of switchable conduction paths.

According to an exemplary embodiment of the present disclosure, the pair of switchable conduction paths may form a quarter wavelength distributed SPDT (single-pole, double-throw) switch, which is also known as a reflective SPDT switch, or a quarter waver reflective SPDT switch, to a person skilled in the art. According to a further embodiment of the present disclosure, each of the pair of switchable conduction paths of the reflective SPDT switch may have a same or different number of quarter wavelength transmission lines at a frequency of operation.

According to a further embodiment of the present disclosure, the pair of the switchable conduction paths may form a distributed SPDT switch, and each path of the pair of switchable conduction paths may have a plurality of series connected unit elements each including a series inductive path and a shunted switch. Further aspects of the present disclosure will be described below with reference to the figures.

FIG. 2A shows a topology of a prior art reflective SPDT switch (200A), comprising a first port, Port1, and two switching ports, Port2 and Port3, each coupled to a respective transistor, S22 and S23, operating as a switch. Switching of the transistors S22 and S23 can be performed via a corresponding control signal, respectively CS22 and CS23. In some exemplary non-limiting embodiments, the transistors (S22, S23) can be FET devices, each having a drain node, a gate node and a source node. Control signals CS22 and CS23 of such FET devices may be provided to the gate node of a respective FET device. Drain nodes of the FET devices may be coupled to a respective one of the switching ports, Port2 and Port3.

With further reference to the reflective SPDT switch (200A) of FIG. 2A, a conduction path between Port1 and each of Port2 and Port3, is provided via a quarter wavelength transmission line, ¼ λ, where λ represents a wavelength corresponding to an operating frequency of an RF signal provided to the reflective SPDT switch (200A). A person skilled in the art readily knows of many possible design implementations for such transmission line which are beyond the scope of the present application.

With continued reference to FIG. 2A, a person skilled in the art readily understands the principle of operation of the shown reflective SPDT switch (200A), where, for example, closing switch S22, which creates a short circuit at Port2 (shorted to a reference ground), makes Port1 see an open circuit (high impedance) through the conduction path leading to the Port2, and opening switch S22, causes a load impedance at Port2 (e.g., Z0, not shown in FIG. 2A) to be seen through an impedance transformed conduction path between Port1 and Port2. Similar behavior can be observed at Port1 by switching ON/OFF (short/open) the switch S23 at Port3. Further operation of the reflective SPDT switch (200A) is shown in FIGS. 2A, 2B and 2C. It should be noted that such principle of operation of the reflective SPDT switch (200A) is based on a signal travelling through the conduction paths (Port1, Port2) and (Port1, Port3) that has a frequency of operation with a corresponding wavelength that is substantially equal to the wavelength λ.

With reference to FIG. 2B, the reflective SPDT switch of FIG. 2A is shown with both transistors (S22, S23) depicted as open switches. In this case, Port1 sees low impedance conduction paths leading to both Port2 and Port3. As a consequence, a signal at Port1 will split and travel through both quarter wavelength transmission lines, ¼ λ, to respective Port2 and Port3. Splitting of the signal may be based on termination impedances at the respective Port2 and Port3. For example, assuming equal termination impedances at the two ports, then the signal at the Port1 may split with equal powers.

Figure 2D:
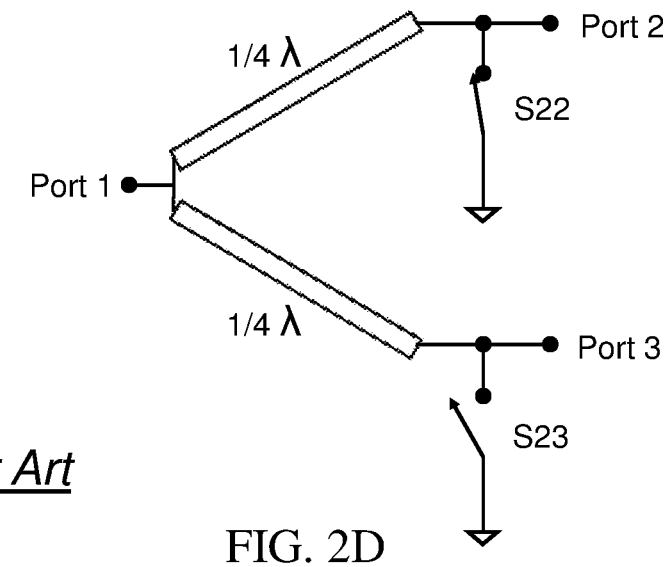

With reference to FIG. 2C, the reflective SPDT switch of FIG. 2A is shown with switch S22 in open position and switch S23 in closed position. Accordingly, a signal at Port1 mainly travels to the low impedance conduction path leading to Port2. Similarly, by virtue of switch S22 being closed and switch S23 being opened, a signal at the Port1 depicted in FIG. 2D mainly travels to the low impedance conduction path leading to Port3.

A person skilled in the art readily knows of many design implementations where transformers are used as a means to isolate certain characteristics of two electrical circuits while transferring electrical energy between the two circuits, via coupling of the two circuits to a respective one of two windings of the transformer, through electromagnetic induction. As known to the person skilled in the art, transformers are frequently used in RF circuit designs as a means to, for example, perform impedance matching between two stages of a circuit (e.g. amplification stages), or to isolate a signal from a reference ground to allow subsequent manipulation of the signal as a differential signal (balanced levels with respect to the reference ground). FIG. 3A and FIG. 3B show two exemplary prior art implementations of using transformers in RF circuits.

As shown in FIG. 3A, a first transformer, T1, may transform a single ended RF signal provided by a voltage source $RF_{IN}$ having a source impedance, $Z_{IN}$, to a differential signal applied to two amplifiers A31, A32, operating in parallel as a differential amplifier (320). A differential signal output by the differential amplifier (320) is then converted back to a single ended signal through a second transformer, T2, which is ultimately terminated with a load impedance $Z_L$. A person skilled in the art readily understands benefits provided by such configuration, including i) efficient transfer of electrical energy from the voltage source $RF_{IN}$ to the differential amplifier (320) in spite of possible impedance mismatch between the output of the voltage source $RF_{IN}$ and the input of the differential amplifier (320), ii) isolation with respect to the reference ground of the amplification process performed by the differential amplifier (320), and iii) efficient transfer of electrical energy from the output of the differential amplifier (320) to the load impedance $Z_L$ in spite of possible impedance mismatch between the output of the differential amplifier (320) and the load impedance $Z_L$. As shown in FIG. 3B, in some applications where, for example, the load impedance $Z_L$ is substantially matched with the output impedance of the differential amplifier (320), the second transformer may be omitted.

With further reference to the prior art configurations depicted in FIGS. 3A and 3B, a person skilled in the art would know of similar implementation designs where a selectable phase of an incoming RF signal may be desired, that is: according to a first state of a phase shifter circuit, a first phase of an output RF signal with respect to the incoming RF signal is provided, and according to a second state of the phase shifter circuit, a second phase of the output RF signal with respect to the incoming RF signal is provided, where the first phase is a reference phase and the second phase is a phase shift with respect to the first phase. According to an embodiment of the present disclosure, an existing transformer of a circuit design (e.g., as depicted in FIGS. 3A, 3B) may be advantageously used in combination with a reflective SPDT switch (e.g., as depicted in FIG. 2A), to provide a low loss (e.g. 1.5 dB to 2.0 dB) switching phase shift that operates within a wide frequency range of operation (e.g., near DC to 300 GHz, for example, 100 MHz to 300 GHz) of an RF signal.

Figure 4A:
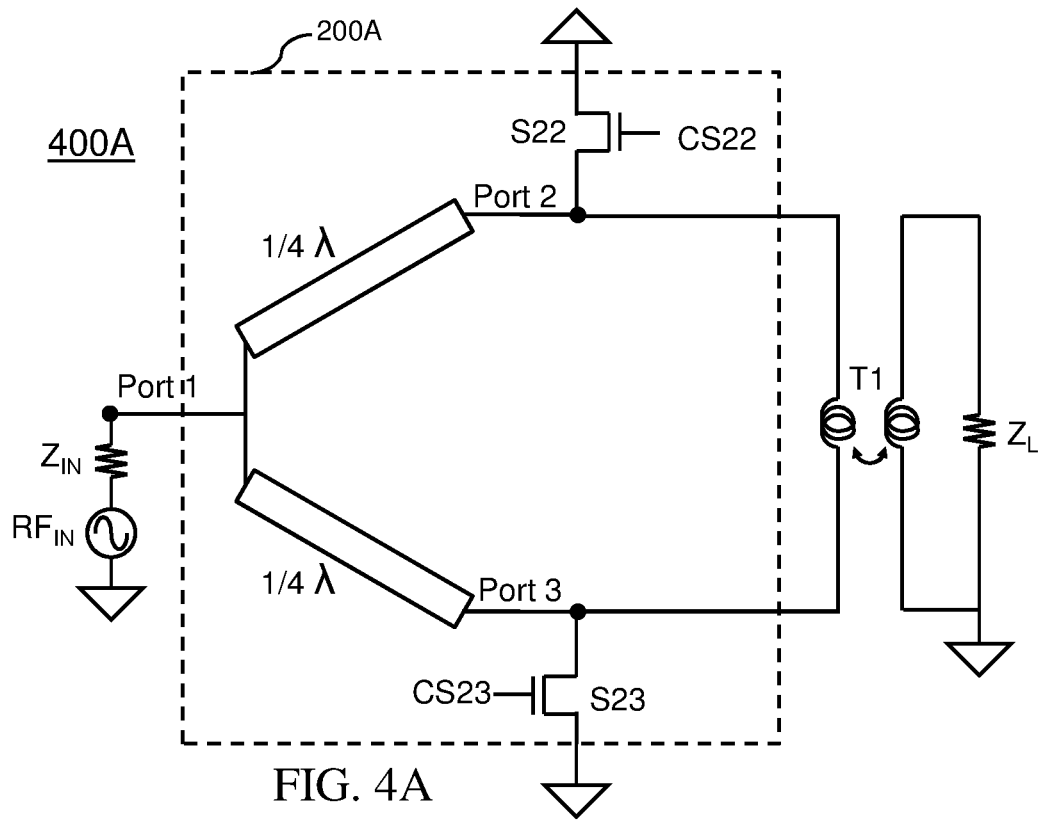
FIG. 4A shows a topology, according to an embodiment of the present disclosure, of a low loss, wide band, phase shifter utilizing a transformer and a reflective SPDT switch.

FIG. 4A shows a topology, according to an embodiment of the present disclosure, of a low loss, wide band, phase shifter (400A) utilizing a transformer, T1, and a reflective SPDT switch (200A) coupled, by way of its Port2 and Port3, to a first winding of the transformer T1. Operation of the phase shifter (400A) is exemplified in configurations depicted in FIGS. 4B-4E, with performance plots shown in FIGS. 5A-5B and 6A-6B. It should be noted that a person skilled in the art would understand that although not explicitly shown in the figures of the present disclosure, number of turns of primary and secondary transformer (e.g. T1) windings, N1 and N2, may be same or different, where a turn ratio N=N1/N2 defines a transformation (e.g. voltage, impedance) through the transformer. Also, a person skilled in the art is well aware that a relative phase shift (e.g., 180°, 0°) of an AC signal through a transformer may be function of winding directions (CW, CCW) used in the primary and secondary transformer windings. The various embodiments according to the present disclosure are adaptable to transformers having any turn ratio and winding directions as required by specific design goals.

Figure 4B:
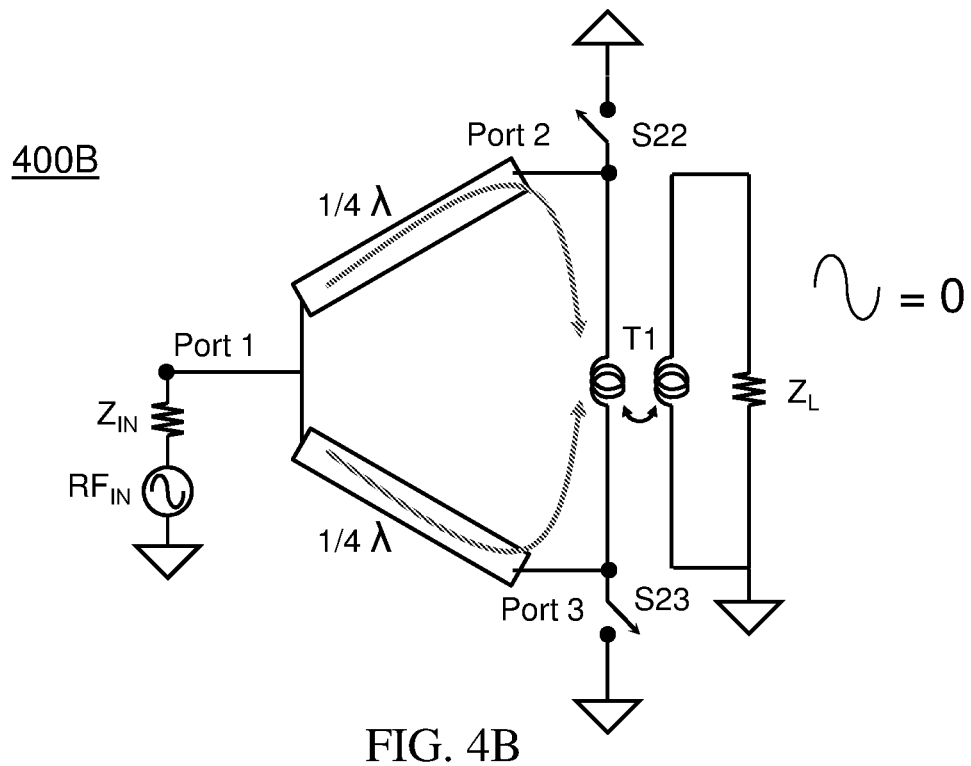
FIGS. 4B, 4C, 4D and 4E show the phase shifter of FIG. 4A in different states.

As shown in FIG. 4B, when both switches (S22, S23) of the reflective SPDT switch (200A) are open, Port1 sees low impedance conduction paths to both Port2 and Port3, where both latter ports are connected to opposite nodes of a first winding of the transformer T1. As a consequence, Port2 and Port3 see a same impedance through the first winding of the transformer T1, and a current corresponding to an RF signal of amplitude $RF_{IN}$ at Port1 splits equally to travel through each of the low impedance paths, as indicated by the current directional arrows in FIG. 4B. As both low impedance paths provided by the two quarter wavelength transmission lines, ¼ λ, provide a same phase delay (e.g. 90°) of signals through the paths, the split signals (i.e. currents) combine in antiphase (i.e., destructive interference) through the first winding of the transformer T1, and therefore null one another, for an effective zero mutually induced current through the second winding of the transformer T2, and an effective zero volts signal at the load $Z_L$ coupled to the second winding of the transformer T1. A person skilled in the art would realize that the configuration 400B depicted in FIG. 4B can effectively be considered as representative of an attenuation state between Port1 and the load $Z_L$.

Figure 4C:
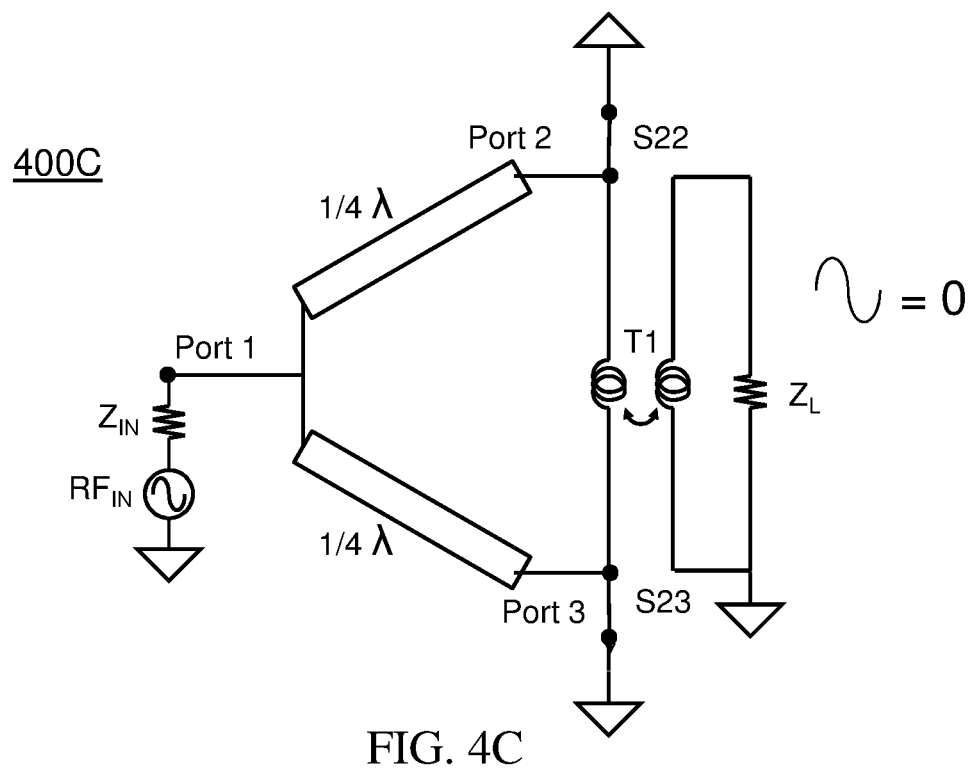

As shown in FIG. 4C, when both switches (S22, S23) of the reflective SPDT switch (200A) are closed, Port1 sees high impedance conduction paths to both Port2 and Port3, where both latter ports are connected to opposite nodes of a first winding of the transformer T1. Therefore, the first winding of the transformer T1 is connected to the same reference ground and no current flows through the first and the second windings of the transformer T1, for an effective zero volts signal at the load $Z_L$ coupled to the second winding of the transformer T1. The configuration 400C depicted in FIG. 4C can effectively be considered as representative of a high isolation state between Port1 and the load $Z_L$. This configuration has an advantage over the configuration of FIG. 4B that the first winding does not load $Z_L$, and vice versa, even for a case where a mismatch between the two quarter wavelength transmission lines, ¼λ, exists.

Figure 4D:
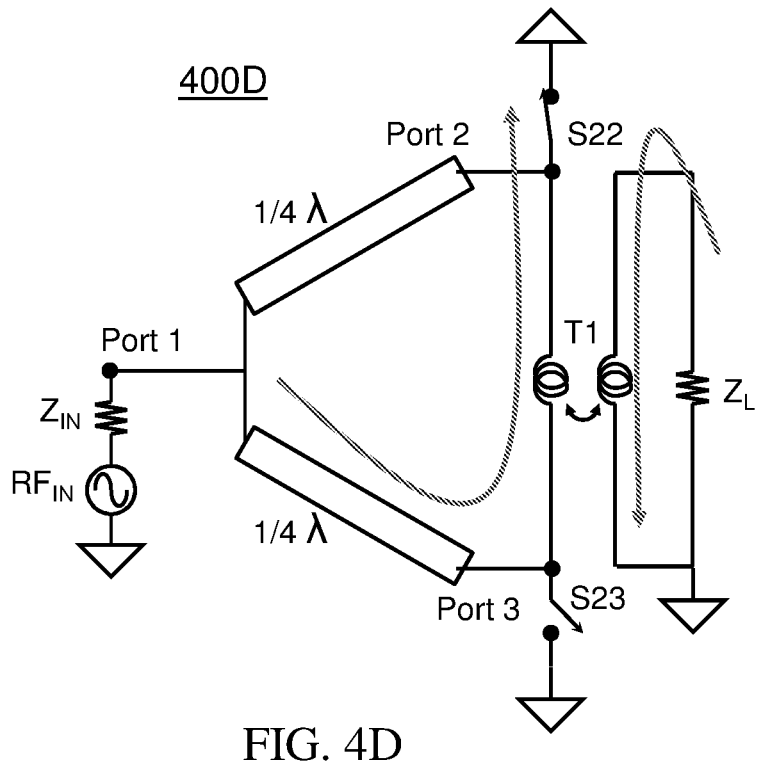

As shown in FIG. 4D, when switch S22 is closed and switch S23 is open, Port1 sees a low impedance conduction path to Port3 and a high impedance conduction path to Port2. As a consequence, a current corresponding to an RF signal of amplitude $RF_{IN}$ at Port1 travels mainly through the low impedance path to Port3, and then to the reference ground provided by the closed switch S22 at Port2 through the first winding of the transformer T1, as indicated by the current directional arrows in FIG. 4D. As a consequence of the current through the first winding of the transformer T1, a mutually induced current is produced through the second winding of the transformer T1. As previously noted, depending on transformer T1 construction, such mutually induced current may be either in phase (0°) or antiphase (180°) with respect to the current through the first winding of the transformer T1.

Figure 4E:
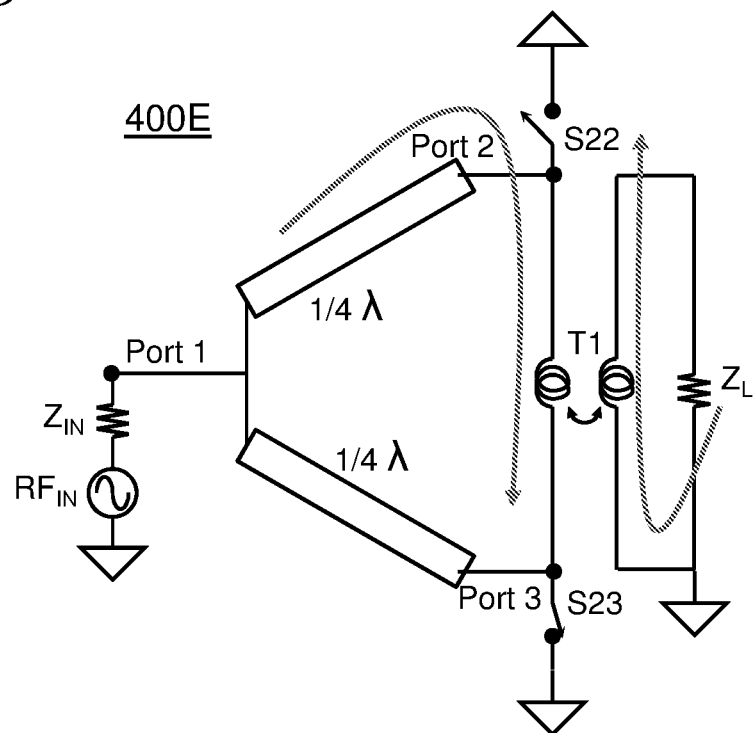

Similarly, in the case depicted in FIG. 4E, a current corresponding to an RF signal of amplitude $RF_{IN}$ at Port1 travels mainly through the low impedance path to Port2 and then to the reference ground provided by the closed switch S23 at Port3 through the first winding of the transformer T1, but according to a direction opposite of the current through the first winding in the case depicted in FIG. 4D. As a consequence of the current through the first winding of the transformer T1, a mutually induced current produced through the second winding of the transformer T1 in the case depicted in FIG. 4E is in antiphase (180°) to the current produced in the case depicted in FIG. 4D, and independent of the construction of the transformer T1 that may alter relationship between currents in the first and second windings (e.g. phase or antiphase) in cases of FIGS. 4C and 4D.

Based on the above description with respect to FIGS. 4B, 4C, 4D and 4E, it becomes clear that a voltage provided at the load $Z_L$ by the phase shifter (400A) according to the present disclosure can be selectively switched to be zero volts, for the case depicted in FIGS. 4B and 4C, or switched between two voltages of substantially a same amplitude but of opposite phases (i.e. 180°), per the cases depicted in FIGS. 4D and 4E. As a person skilled in the art would understand, switching of the reflective SPDT switch (200A) can control a direction of a current corresponding to the $RF_{IN}$ signal through the first (primary) winding of the transformer T1. In turn, controlling of the direction of such current can provide functionality as a phase shifter according to the present disclosure.

Figure 5A:
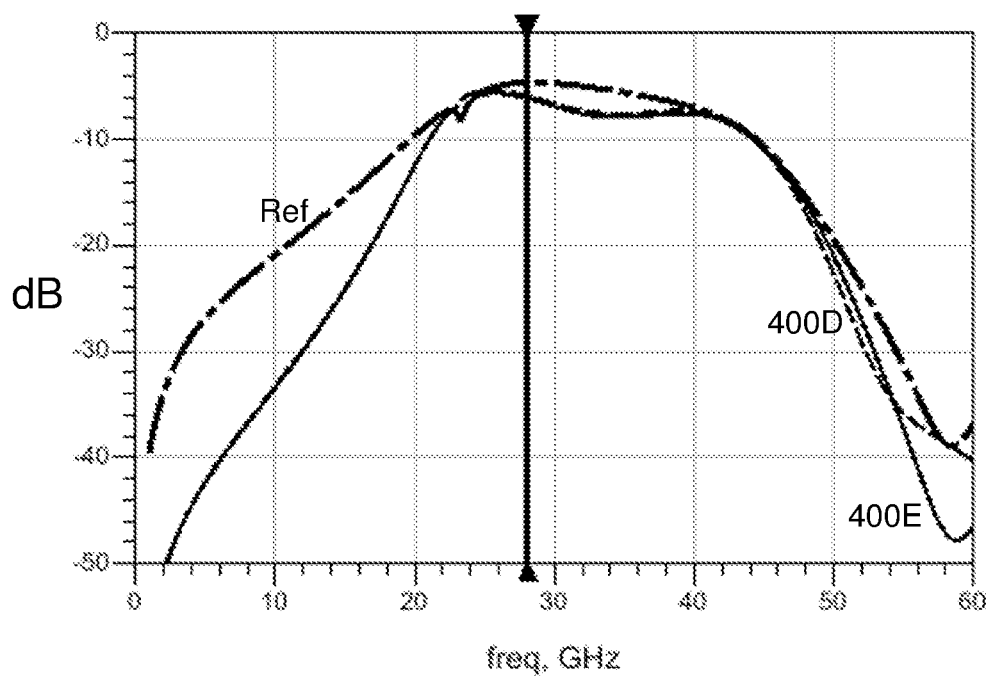
FIG. 5A shows an exemplary measured amplitude versus frequency plot of the phase shifter of FIG. 4A.

FIG. 5A shows an exemplary measured relative amplitude (with respect to input amplitude at Port1) versus frequency plot of the phase shifter (400A) according to the present disclosure shown in FIG. 4A, when operating according to the configurations (400D) of FIG. 4D and (400E) of FIG. 4E, and further referenced to a reference plot, Ref, corresponding to an amplitude versus frequency plot for an ideal case of optimum impedance matching at ports Port1, Port2 and Port3. As can be seen in FIG. 5A, relative amplitudes at the output of the phase shifter (400A) for the configurations (400C) and (400D) are substantially same over a wide frequency range and about 4.6 dB below an amplitude of the input signal (at Port1). It should be noted that design of the phase shifter (400A) whose measured relative amplitude plot is depicted in FIG. 5A, may be according to an operating frequency of an input RF signal, and therefore, the peak observed in the plot may be changed according to a target operating frequency (e.g. about 28 GHz in the case depicted in FIG. 5A). As noted above, such target operating frequency can be any frequency within a range of near DC to 300 GHz, for example, 100 MHz to 300 GHz.

With further reference to FIG. 5A, it should be noted that for measuring purposes, a second phase shifter (400A) was provided in a series connection with a first one (e.g. coupled to the secondary winding of the transformer T1), and therefore the measured relative amplitude as plotted in FIG. 5A corresponds to losses through two, not one, phase shifters (400A). It can therefore be deduced from the plot of FIG. 5A, that the effective loss (e.g., insertion loss) through one phase shifter (400A) at an exemplary target frequency of about 28 GHz (as indicated by the vertical marker line in FIG. 5A) is about 4.6/2=2.3 dB, of which, about 0.90 dB to 1.0 dB are losses that may be associated with a resistance of the transformer T1 windings. A person skilled in the art would appreciate the reduced loss (2.3 dB versus 3 dB and beyond for the prior art) provided by the phase shifter (400A) according to the present disclosure. In particular, when considering applications where the transformer T1 is required by design, as discussed above in relation to the exemplary configurations of FIGS. 3A and 3B, an incremental loss provided by the reflective SPDT switch (200A) to complete the phase shifter (400A) according to the present teachings is about 2.3−0.90=1.4 dB.

Figure 5B:
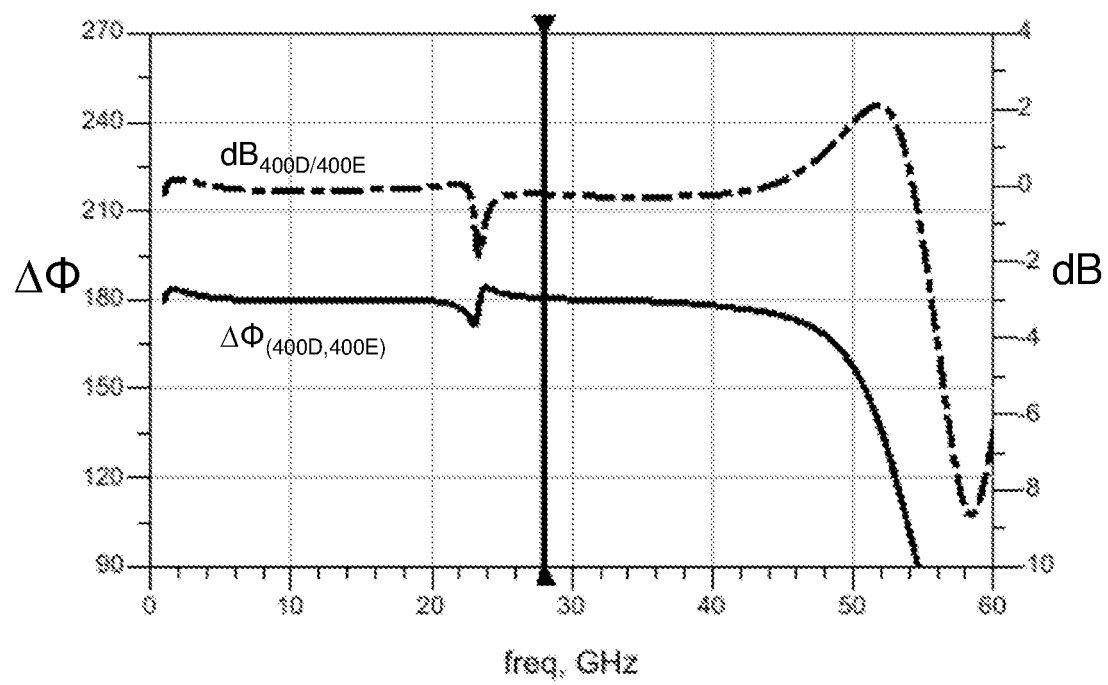
FIG. 5B shows exemplary measured performance plots of the phase shifter of FIG. 4A for two different states, including an amplitude difference versus frequency plot, and a phase difference versus frequency plot.

FIG. 5B shows exemplary measured performance plots of the phase shifter (400) of FIG. 4A when operating according to the configurations (400D) of FIG. 4D and (400E) of FIG. 4E, including an amplitude difference between said configurations versus frequency plot ($dB_{400D/400E}$), and a phase difference between said configurations versus frequency plot ($\Delta\Phi_{(400D,400E)}$). As can be seen in FIG. 5B, a measured amplitude difference of about 0.225 dB and phase difference of about 180.580 is observed at the target frequency of 28 GHz indicated by the vertical marker line.

Figure 6A:
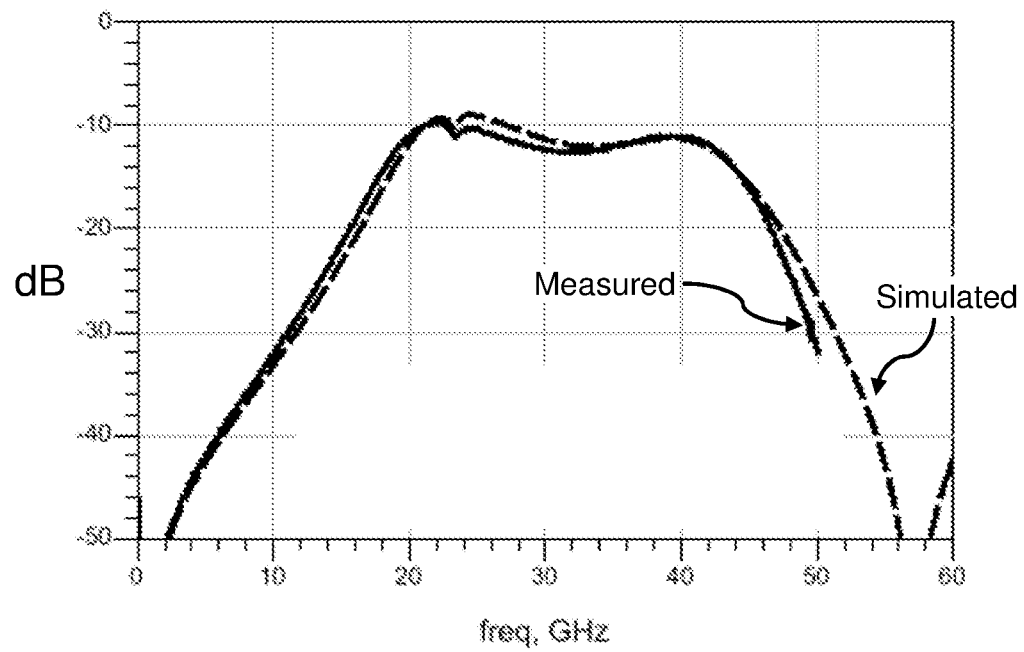
FIGS. 6A and 6B show simulated plots of the phase shifter of FIG. 4A, contrasted with the measured plots of FIGS. 5A and 5B respectively.
Figure 6B:
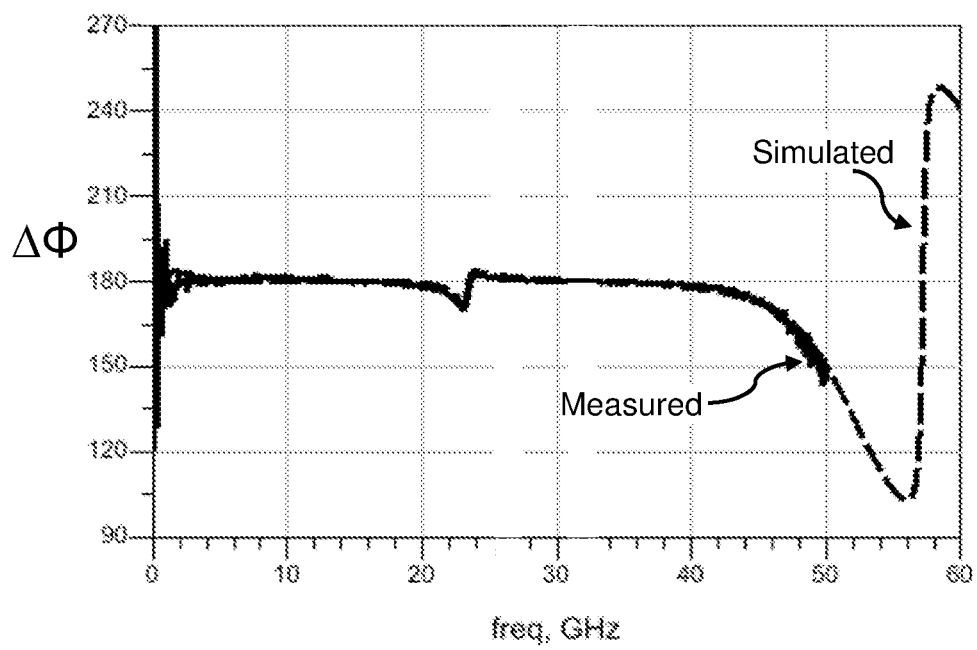

FIGS. 6A and 6B show simulated plots of the phase shifter of FIG. 4A, contrasted with the measured plots of FIGS. 5A and 5B respectively. A person skilled in the art would appreciate the good correlation between the measured performance plots and the simulated performance plots indicated by the quasi perfect superimposition of the plots as shown in FIGS. 6A and 6B.

Figure 7A:
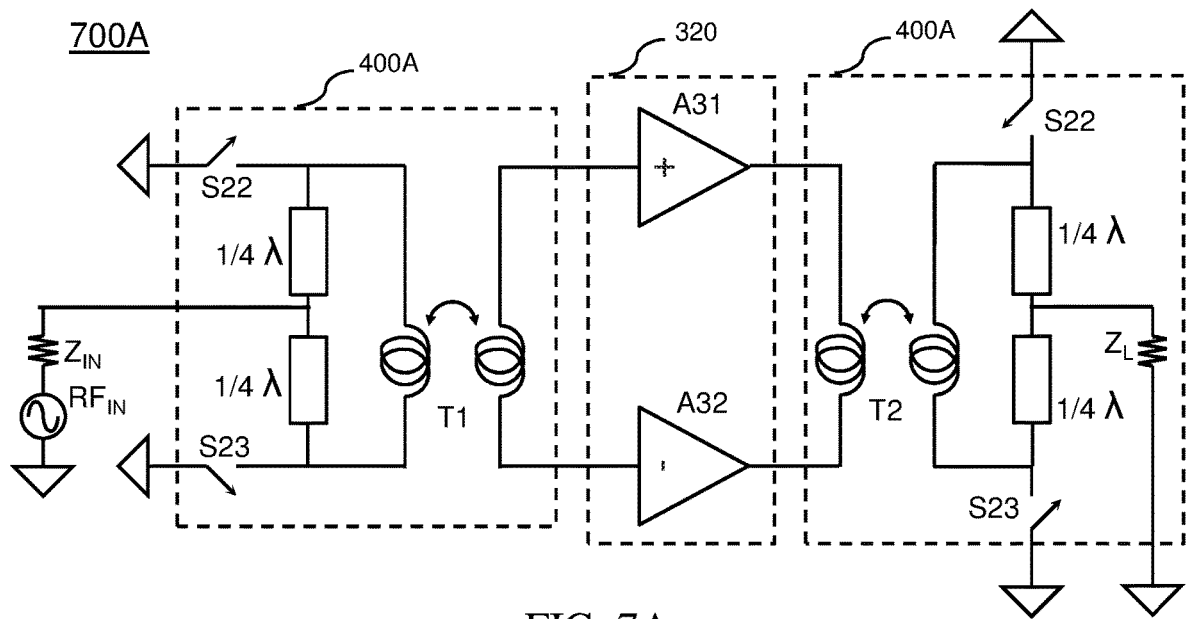
FIG. 7A shows an exemplary embodiment according to the present disclosure of a differential RF amplifier having coupled, to each of its input and output, a phase shifter as shown in FIG. 4A.
Figure 7B:
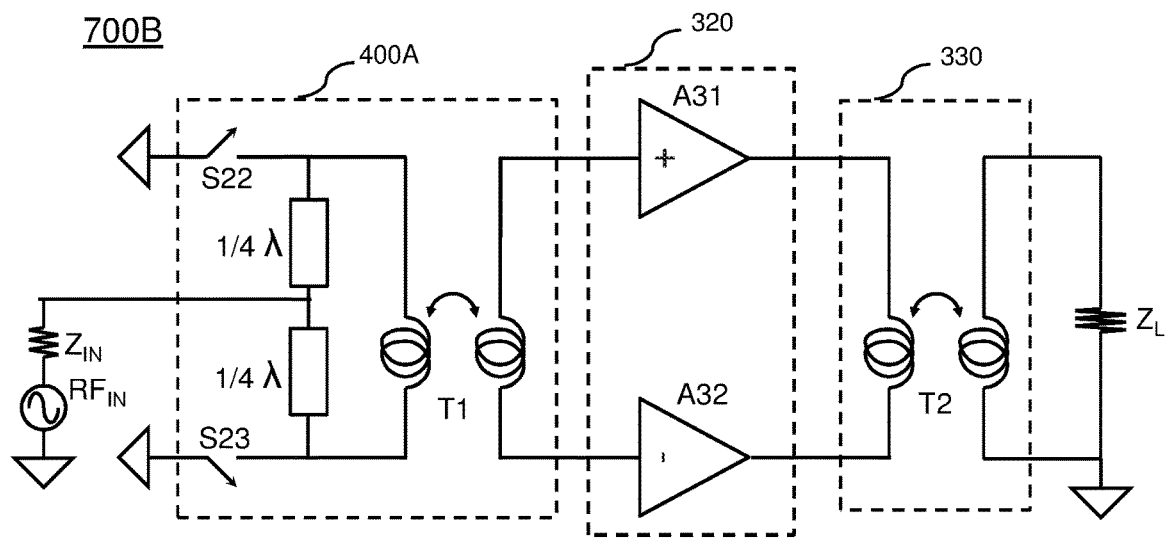
FIG. 7B shows an exemplary embodiment according to the present disclosure of a differential RF amplifier having coupled, to its input, a phase shifter as shown in FIG. 4A.
Figure 7C:
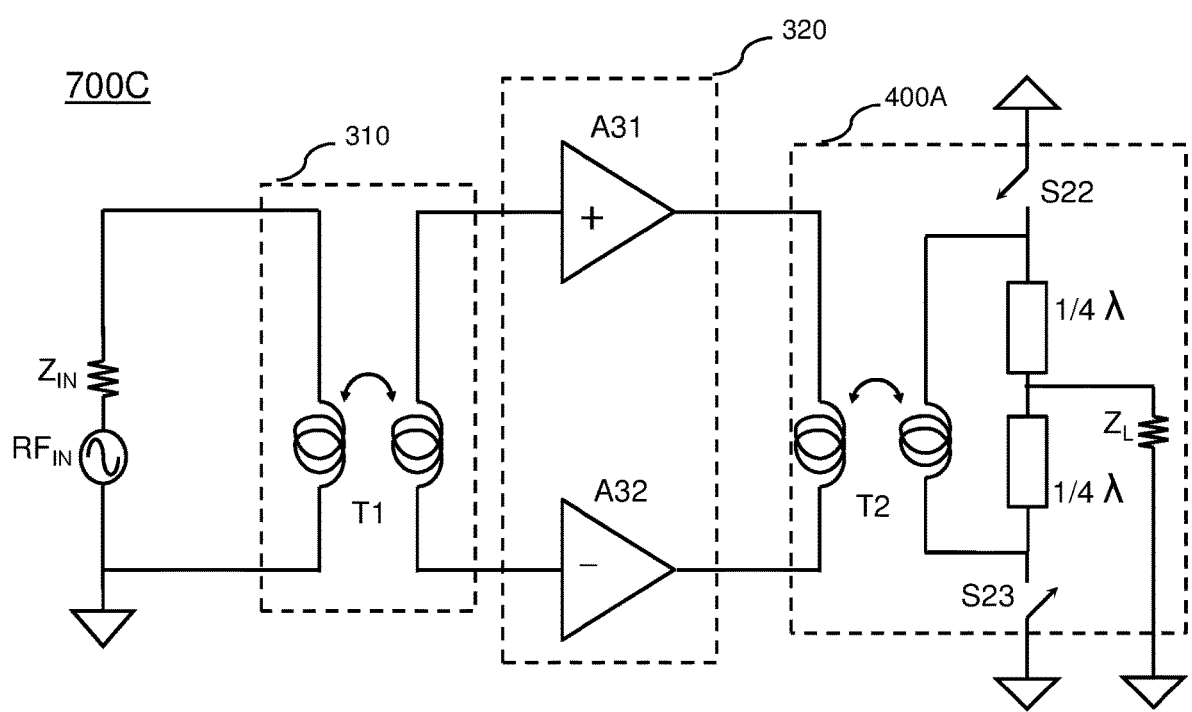
FIG. 7C shows an exemplary embodiment according to the present disclosure of a differential RF amplifier having coupled, to its output, a phase shifter as shown in FIG. 4A.

FIG. 7A shows an exemplary embodiment (700A) according to the present disclosure of a differential RF amplifier (320) having coupled, to each of its input and output, a phase shifter similar to the phase shifter (400A) of FIG. 4A. As previously discussed with relation to FIGS. 3A and 3B, the transformers T1 and T2 may be required for reasons beyond implementation of the phase shifter (400A), such as, for example, an impedance transformation. In other words, and according to an embodiment of the present disclosure, one or both of the transformers T1 and T2 may be "re-used" for completing the phase shifter (400A) by coupling a reflective SPDT switch to each of the transformers, while introducing a reduced insertion loss and allowing for a more compact physical layout of the circuit (700A). FIG. 7B shows another exemplary embodiment according to the present disclosure of a differential RF amplifier (320) having coupled, to its input, the phase shifter (400A) of FIG. 4A, where similarly to the embodiment of FIG. 7A, the phase shifter (400) may, in some cases, be completed by coupling a reflective SPDT switch to an existing transformer T1. FIG. 7C shows yet another exemplary embodiment according to the present disclosure of a differential RF amplifier (320) having coupled, to its output, the phase shifter (400A) of FIG. 4A, where similarly to the embodiments of FIGS. 7A and 7B, the phase shifter (400A) may, in some cases, be completed by coupling a reflective SPDT switch to an existing transformer T1. Design goals and/or requirements may dictate a coupling of the phase shifter (400A) relative to an input stage and/or output stage of the differential RF amplifier (320) per any one of the configurations of FIGS. 7A, 7B and 7C. A person skilled in the art would appreciate that appropriate selection of the turn ratio N of any one of the transformers T1 and T2 depicted in FIGS. 7A-7C may further allow impedance transformation while providing a selectable phase shift of a signal through the phase shifter (400A).

Figure 8A:
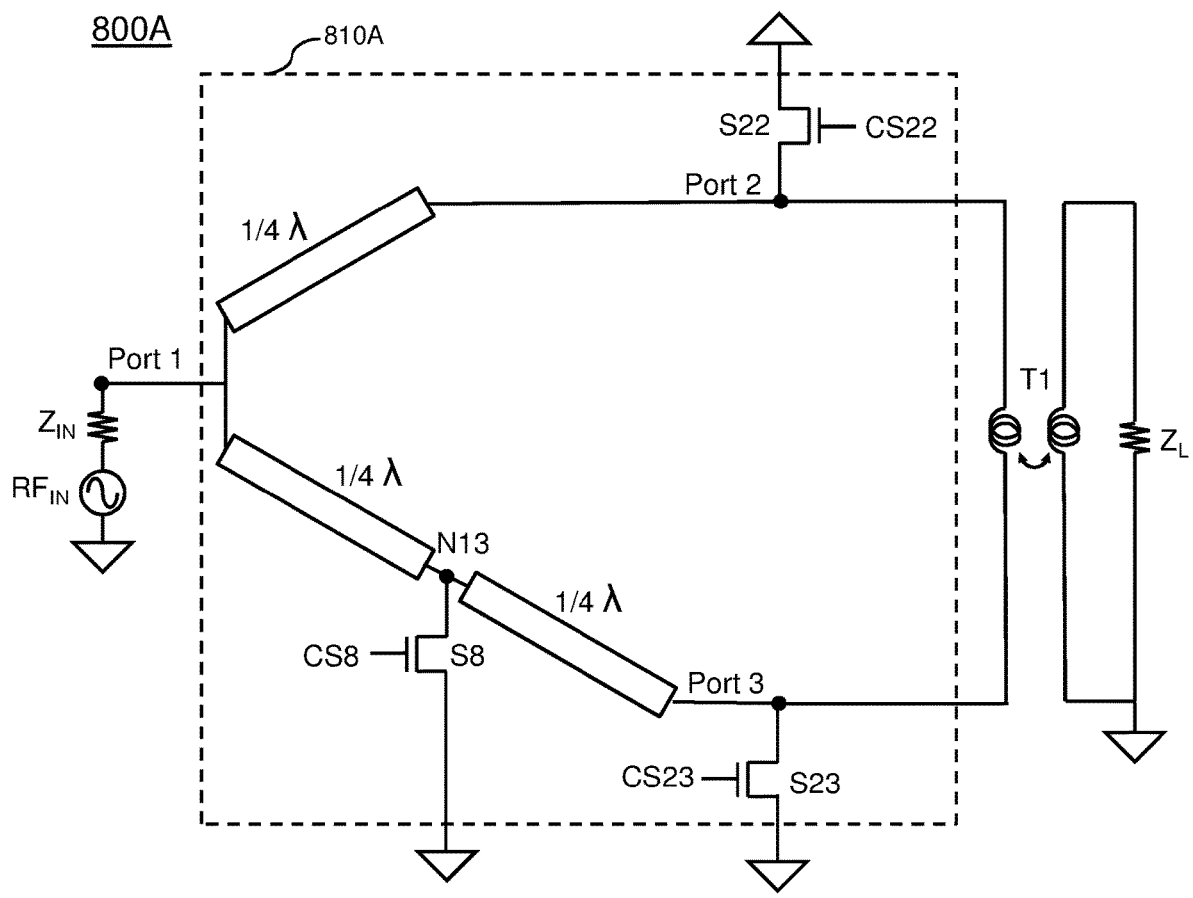
FIG. 8A shows a topology, according to an embodiment of the present disclosure, of a low loss, wide band, phase shifter utilizing a transformer and a reflective SPDT switch, that is based on the phase shifter of FIG. 4A, to provide a frequency specific 90° phase shift between two states of the phase shifter.

FIG. 8A shows a topology, according to an embodiment of the present disclosure, of a low loss, wide band, phase shifter (800A) utilizing a transformer T1 and a reflective SPDT switch (810A), that is based on the phase shifter of FIG. 4A, to provide ninety degrees, 90°, phase shift between two states. A switchable conduction path between Port1 and Port2 is provided via a quarter wavelength transmission line, ¼λ, coupled to a switch at Port2, for a similar operation as described above with reference to FIG. 2A. On the other hand, a switchable conduction path between Port1 and Port3 is provided by two series connected switchable segments each having a quarter wavelength transmission line, ¼λ, respectively coupled to a transistor switch, S8 and S23. In other words, assuming that a quarter wavelength switchable conduction path is defined by the transmission line, ¼λ, coupled to a switch (e.g. S22, S23, S8, etc.), then Port1 and Port2 are coupled through a single quarter wavelength switchable conduction path, and Port1 and Port3 are coupled through two series-connected quarter wavelength switchable conduction paths.

With further reference to FIG. 8A, operation of each of the two series connected quarter wavelength switchable conduction paths is similar to the single quarter wavelength switchable conduction path provided between Port1 and Port2, that is, for example, a short provided by switch S8 (under control of CS8), makes Port1 see a high impedance conduction path through the first quarter wavelength transmission line, ¼λ, coupled to Port1, and an open provided by switch S8, makes Port1 see a low impedance conduction path through the first quarter wavelength transmission line, ¼λ. Similarly, a short provided by switch S23 makes node N13 see a high impedance conduction path through the second quarter wavelength transmission line, ¼λ, coupled to Port3, and an open provided by switch S23, makes node N13 see a low impedance conduction path through the second quarter wavelength transmission line, ¼λ. It follows, that when switches S8 and S23 are open, Port1 is coupled to Port3 through a low impedance conduction path, and when switches S8 and S23 are closed, Port1 is coupled to Port3 through a high impedance conduction path.

With continued reference to FIG. 8A, a phase shift provided through the series connected quarter wavelength switchable conduction paths, between Port1 and Port3, when in the low impedance mode (S8 and S23 open) equals to a sum of a phase shift provided by each of the two quarter wavelength transmission lines, ¼λ, and therefore, a difference in phase shift between operation through a low impedance path provided between Port1 and Port2 and a low impedance path provided between Port1 and Port3 is equal to the extra phase shift provided through a second quarter wavelength transmission line between Port1 and Port3, and is therefore equal to ninety degrees, 90° at the operating frequency corresponding to the wavelength λ. Accordingly, a phase shift between a current through the first winding of the transformer T1 when operating according to two states, (S22, S23, S8)=(ON, OFF, OFF) and (S22, S23, S8)=(OFF, ON, ON), of the phase shifter (800A) is 180°−90°=90°. A person skilled in the art would realize that the exemplary embodiment according to the present disclosure may be modified to include a different number of series connected switchable quarter wavelength conduction paths between any of the two sets of ports, (Port1, Port2) and (Port1, Port3), in order to get a different phase shift, multiple of 90° (e.g. 0°, 90°, 180°, 270°), between said two states, the effective phase shift being based on a difference in number of series connected switchable quarter wavelength conduction paths between the two sets of ports. According to a further embodiment of the present disclosure, the same concept for providing a phase shifter may be applied based on a difference of number of series connected switchable conduction paths between two sets of ports (e.g. (Port1, Port2) and (Port1, Port3)), where the switchable conduction paths may not necessarily be based on a quarter wavelength transmission line, as described later with respect to FIGS. 8B-8C, 10A-10C, 11A and 11B.

Figure 8B:
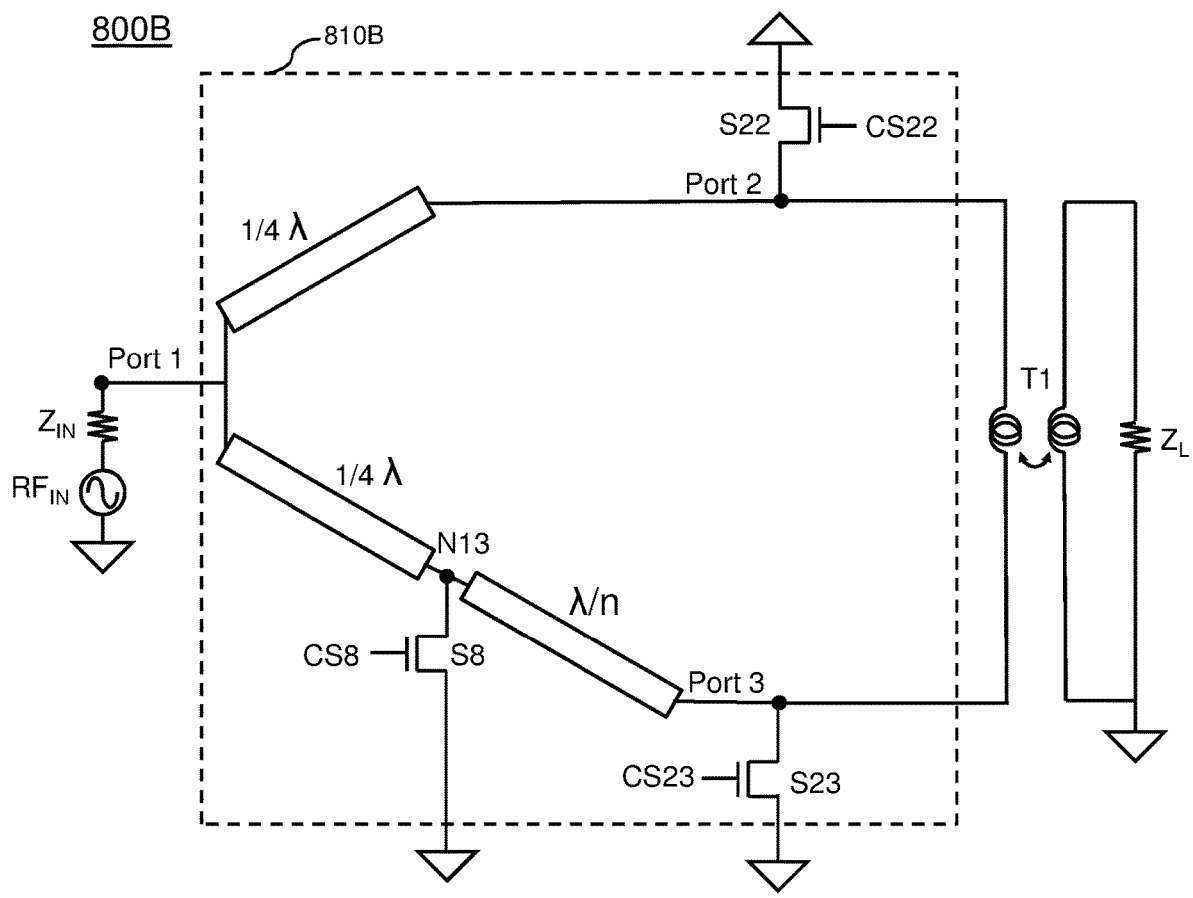
FIG. 8B shows a topology, according to an embodiment of the present disclosure, of a low loss, wide band, phase shifter (800B) utilizing a transformer T1 and a reflective SPDT switch (810B), that is based on the phase shifter of FIG. 8A, to provide any frequency specific phase shift between two states of the phase shifter by way of a transmission line of length λ/n.

FIG. 8B shows a topology, according to an embodiment of the present disclosure, of a low loss, wide band, phase shifter (800B) utilizing a transformer T1 and a reflective SPDT switch (810B), that is based on the phase shifter of FIG. 8A, to provide any frequency specific phase shift between two states by way of an added transmission line of length λ/n. Based on the operation of the phase shifter (800A) of FIG. 8A, a person skilled in the art would realize that a phase shift between a current through the first winding of the transformer T1 when operating according to two states, (S22, S23, S8)=(ON, OFF, OFF) and (S22, S23, S8)=(OFF, ON, ON), of the phase shifter (800B) is 180°−(90/n)°. Accordingly, the phase shift can be made to be of any value at the operating frequency corresponding to the wavelength λ by choosing an appropriate value of n. Alternatively, the value of n can be made according to a desired relative frequency independent time delay of the signal at the load $Z_L$ between operations according to the two states.

Figure 8C:
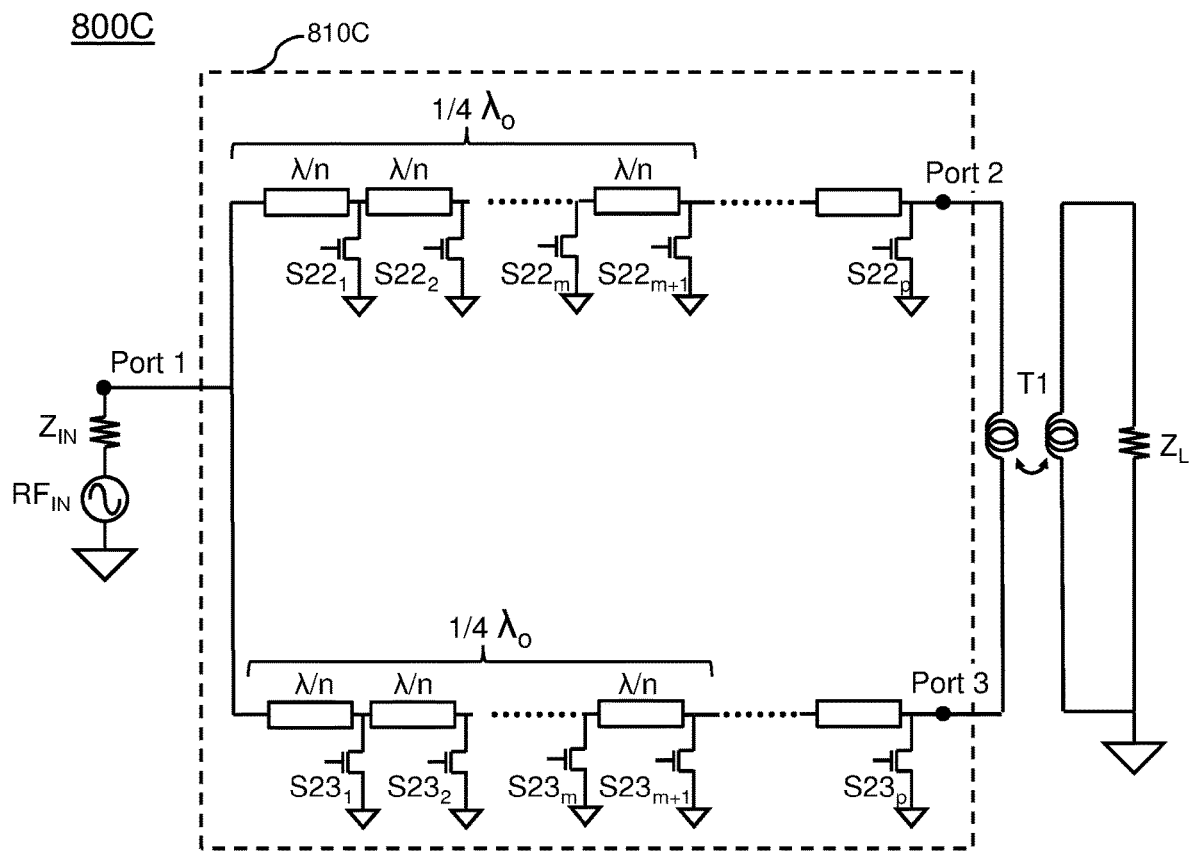
FIG. 8C shows a topology, according to an embodiment of the present disclosure, of a low loss, wide band, phase shifter (800C) utilizing a transformer T1 and a tunable reflective SPDT switch (810C), that is based on the phase shifter of FIG. 4A, to provide a tunable frequency phase shift between two states of the phase shifter.

FIG. 8C shows a topology, according to an embodiment of the present disclosure, of a tunable low loss, wide band, phase shifter (800C) utilizing a transformer T1 and a tunable reflective SPDT switch (810C), that is based on the phase shifter of FIG. 4A, to provide a tunable frequency phase shift, e.g., ninety degrees, 90°, between two states of the phase shifter. A switchable conduction path between Port1 and Port2 is provided via a plurality (e.g. p) of series connected transmission lines of length λ/n (n a number greater than 1), each transmission line coupled to a switch $S22_k$. Similarly, a switchable conduction path between Port1 and Port3 is provided via a plurality (e.g. p) of series connected transmission lines of length λ/n, each transmission line coupled to a switch $S23_k$. As can be seen in FIG. 8C, depending on a frequency of operation $f_o$ of an RF signal at Port1, a corresponding quarter wavelength transmission line, ¼ $λ_o$, may be coupled to Port1 by configuring an appropriate number m of consecutive switches ($S22_1$, $S22_2$, ..., $S22_m$) and/or ($S23_1$, $S23_2$, ..., $S23_m$), to be OFF (open), so to provide a combined transmission line of length (m+1)*λ/n=¼ $λ_o$, where $λ_o$ is the wavelength corresponding to the frequency of operation $f_o$. Accordingly, switches $S22_{(m+1)}$ and $S23_{(m+1)}$ can each be used to control operation of the tunable reflective SPDT switch (810C) according to at least two different states, State1 and State2, in a manner similar to switches S22 and S8 depicted in FIG. 8B, where:

State 1: ($S22_{(k)}$, $S23_{(k)}$)=(ON, OFF) for k=m+1, m+2, ..., p
($S22_k$, $S23_k$)=(OFF, OFF) for k=1, 2, ..., m
State 2: ($S22_{(k)}$, $S23_{(k)}$)=(OFF, ON) for k=m+1, m+2, ..., p
($S22_k$, $S23_k$)=(OFF, OFF) for k=1, 2, ..., m.

With continued reference to FIG. 8C, since a same number of series connected transmission lines are provided between Port1, Port2 and Port1, Port3, the remaining series connected transmission lines between switches $S22_{(m+1)}$ and $S23_{(m+1)}$ may provide a same additional phase shift and/or time delay when operating in any one of the two states, State1, State2, and therefore may cancel one another when considering a relative phase shift between operation in the two states. Alternatively, by providing a number of series connected transmission lines between Port1 and Port2 that is different from a number of series connected transmission lines between Port1 and Port3, the remaining series connected transmission lines may be used to provide an effective phase shift and/or time delay between operation in the two states, State1 and State2, in a manner similar to the embodiments of FIGS. 8A and 8B described above (e.g. based on a difference between the two sets of remaining series connected transmission lines).

Figure 9A:
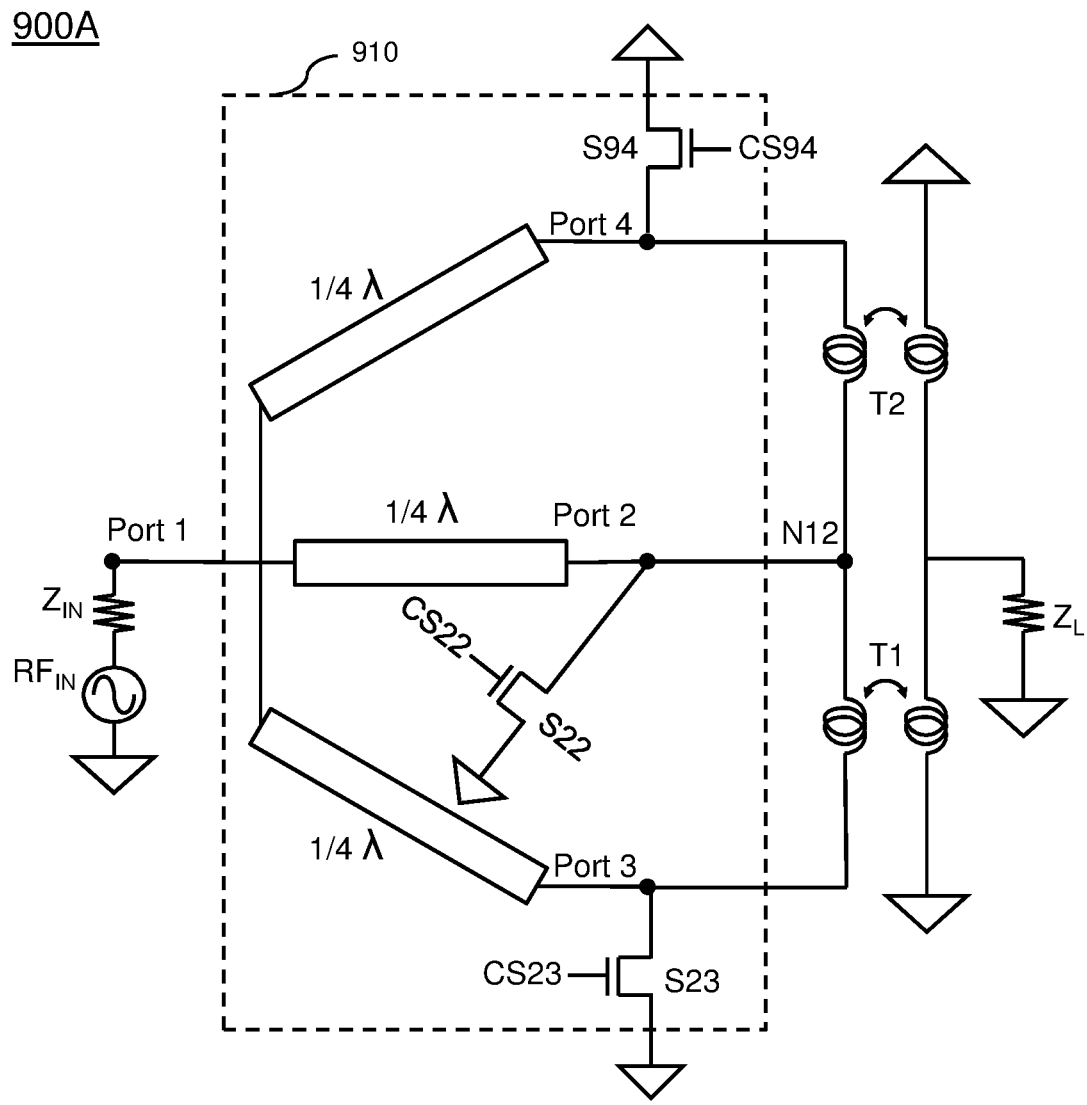
FIG. 9A shows a topology, according to an embodiment of the present disclosure, of a low loss, wide band, phase shifter utilizing two transformers configured in parallel power combining.

The phase shifters according to the present disclosure described above with reference to FIGS. 4A and 8A, provide an output voltage at a second winding of a transformer (e.g. T1 of FIGS. 4A and 8A) that is coupled, through opposite ends of the second winding, to a load (e.g. $Z_L$ of FIGS. 4A and 8A). In this case, the output voltage is also present across the second winding. Applicant of the present disclosure refers to such mode of operation of the phase shifter according to the present disclosure as a "voltage" mode or series mode. FIG. 9A shows an embodiment according to the present disclosure of a "current" mode or parallel mode phase shifter (900A) where currents generated at secondary windings of two series connected transformers T1, T2, are constructively combined in an output load $Z_L$. As can be seen in FIG. 9A, a voltage across the two secondary windings of the transformers T1 and T2 remain constant, and an output power (or voltage) at the load $Z_L$ is provided by combining of (parallel) currents through the two secondary windings into the load $Z_L$.

With further reference to the (current mode) phase shifter (900A) shown in FIG. 9A, a reflective single-pole, triple-throw switch (910) comprising three switchable conduction paths between port sets (Port1, Port2), (Port1, Port3) and (Port1, Port4), each switchable conduction path similar in operation to any of the switchable conduction paths described above with reference to FIG. 2A. As can be seen in FIG. 9A, the reflective switch (910) is coupled to two (electrically matched, e.g., same electrical characteristics) series connected transformers, T1, T2, through different ports: Port2 is coupled (connected) to a common node N12 formed by the two series connected primary windings of the series connected transformers T1, T2; Port3 is coupled to a node opposite the common node N12 of the primary winding of the transformer T1; and Port4 is coupled to a node opposite the common node N12 of the primary winding of the transformer T2. Operation of the phase shifter (900A) is exemplified by the configurations depicted in FIGS. 9B and 9C, where a phase shift of a signal into the load $Z_L$ is provided between operations according to such configurations.

Figure 9B:
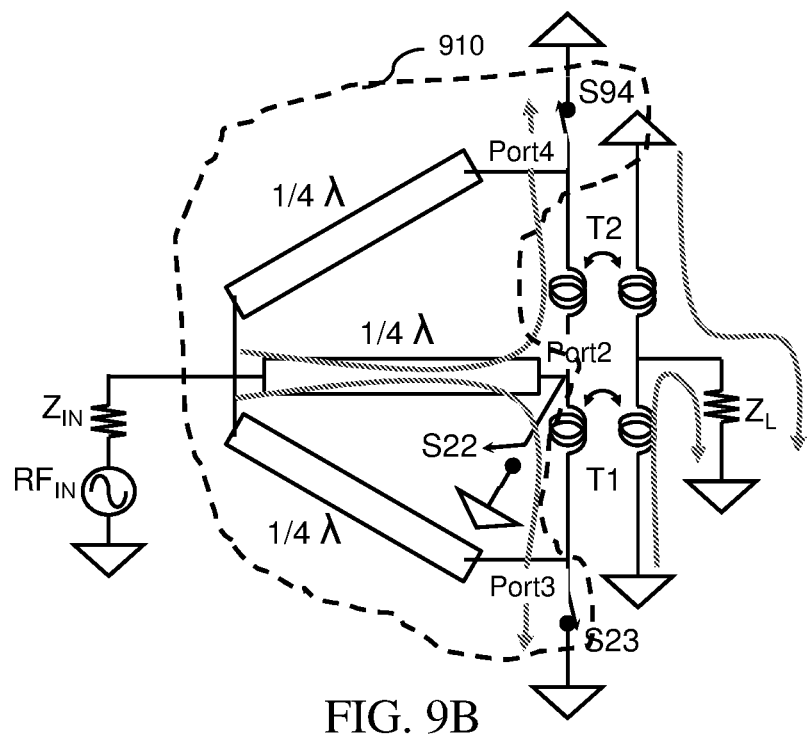
FIGS. 9B and 9C show the phase shifter of FIG. 9A in different states.

As shown in FIG. 9B, when both switches (S94, S23) of the reflective switch (910A) are closed and switch S22 is open, Port1 sees a low impedance conduction path to Port2 and high impedance conduction paths to Port3 and Port4. Also, Port2 sees a same impedance to ground provided by conduction paths through each of the primary windings of the transformers T1, T2 to the shorted switches S94, S23. As a consequence, a current corresponding to an RF signal of amplitude $RF_{IN}$ at Port1 travels from Port1 to Port2 and splits equally at Port2 to travel to the ground provided at Port3 and Port4 through the primary windings of T1 and T2, as indicated by the current directional arrows in FIG. 9B. Therefore, as shown in FIG. 9B, secondary currents mutually induced through the secondary windings of the transformers T1 and T2 may be opposite in phase (antiphase) and therefore may constructively combine (add) into the load $Z_L$. As described above, depending on transformer windings construction, e.g., windings directions, signal at both primary and secondary can be made to be either in antiphase, as per above, or in phase, without affecting a principle of operation of the phase shifter according to the present disclosure, that is, to provide a (desired) phase shift at a frequency of operation of a signal at the load between two states of the phase shifter.

Figure 9C:
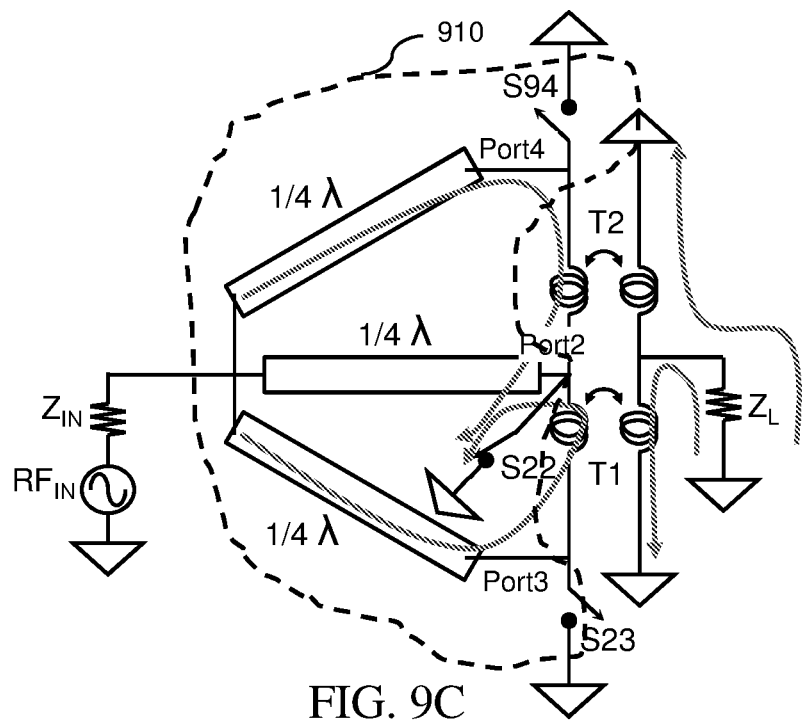

As shown in FIG. 9C, when both switches (S94, S23) of the reflective switch (910A) are open and switch S22 is closed, Port1 sees a low impedance conduction path to Port3 and Port4, and a high impedance conduction path to Port2. Also, each of Port3 and Port4 sees the same impedance to ground provided by conduction paths through each of the primary windings of the transformers T1, T2 to the shorted switch S22. As a consequence, a current corresponding to an RF signal of amplitude $RF_{IN}$ at the Port1, splits equally at Port1 to travel to Port3 and Port4 and then to the ground provided at Port2 through the primary windings of T1 and T2, as indicated by the current directional arrows in FIG. 9C. Therefore, as shown in FIG. 9C, secondary currents induced in the secondary windings of the transformers T1 and T2 are opposite in phase (antiphase) and therefore constructively combine (add) into the load $Z_L$. However, as can be seen by the current directional arrows of FIGS. 9B and 9C, the secondary current mutually induced in the secondary winding of the transformer T1 per the configuration of FIG. 9B is in antiphase to the secondary current mutually induced in the second winding of the transformer T1 per the configuration of FIG. 9C, and the secondary current mutually induced in the second winding of the transformer T2 per the configuration of FIG. 9B is in antiphase to the secondary current mutually induced in the second winding of the transformer T2 per the configuration of FIG. 9C. It follows that a phase difference (phase shift) of a signal at the load $Z_L$ between operation of the phase shifter of FIG. 9A according to the configurations of FIGS. 9B and 9C is one hundred and eighty degrees, 180°. As previously described, depending on transformer windings construction, e.g., windings directions, signal at both primary and secondary of the transformers T1, T2 can be made to be either in antiphase, as per above description related to FIGS. 9B and 9C, or in phase, without affecting the phase shift provided between operation according to the configurations of FIGS. 9B and 9C. Finally, it should be noted that phase shift as a difference in phase between the two configurations of FIGS. 9A and 9B may be related to a reference phase according to an arbitrarily selected reference phase between one of the two configurations.

Figure 10A:
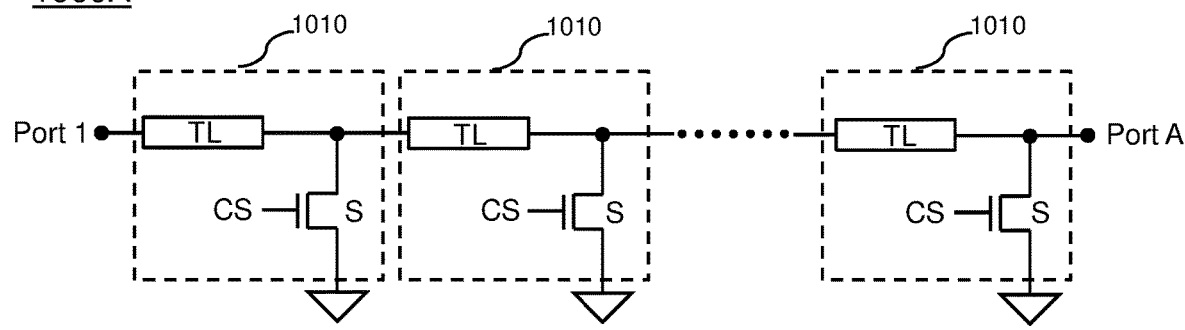
FIG. 10A shows a distributed element model of a switchable conduction path having a plurality of series connected unit elements.
Figure 10B:
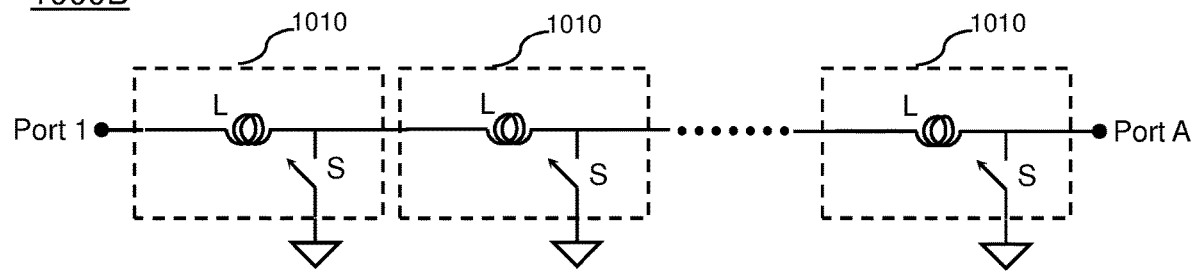
FIG. 10B shows the distributed element model of FIG. 10A, with the series connected unit elements each including a series inductive path and a shunted switch.

FIG. 10A shows a distributed element model of a switchable conduction path (1000A) having a plurality of series connected unit elements (1010). As can be seen in FIG. 10A, each unit element (1010) may comprise a transmission line, TL, of controlled impedance, and a shunted transistor, S, that operates as a switch (ON/OFF) based on a control signal, CS, to the transistor. As can be seen in FIG. 10B, the transmission line TL can be represented by an inductance L. A person skilled in the art would appreciate benefits provided by not using series connected transistors in the switchable conduction path (1000A), as such series connected transistors may require to be specifically designed as a function of a power (e.g. current) handling property of the switchable conduction path (1000A). Furthermore, such series connected transistors may introduce undesirable added insertion loss through the switchable conduction path (1000A).

Figure 10C:
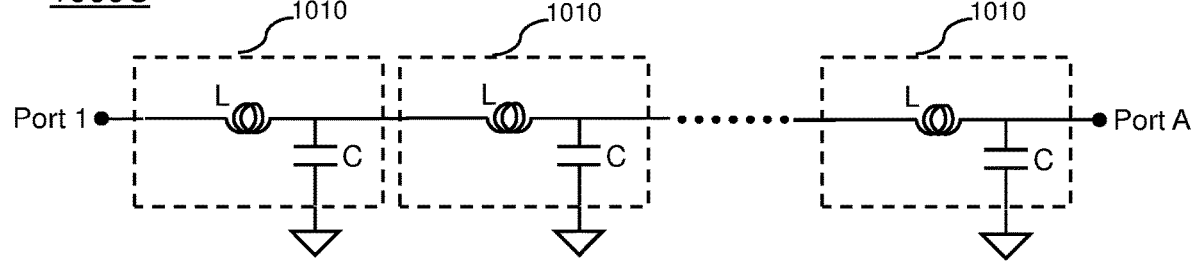
FIG. 10C shows the distributed element model of FIG. 10B, with the shunted switch represented by its OFF capacitance.

FIG. 10C shows the distributed element model of the switchable conduction path (1000A) during an ON mode of operation, where the ON mode of operation is defined by each shunted switch (transistor), S, of each unit element (1010), being turned OFF (switch is open), where the turned OFF shunted switch, S, of each unit element (1010) is represented by its OFF capacitance, C. A person skilled in the art readily knows that the combination of the inductance L and OFF capacitance, C, of each unit element (1010) provides functionality of a second order low pass filter having a phase shift at a frequency of operation of a signal provided to the filter that is a function the inductance L and the OFF capacitance, C. By varying the inductance L via design parameters of the transmission line TL, and the OFF capacitance, C, via design parameters (e.g. size) of the transistor S, a desired phase shift of the unit element (1010), and therefore a desired total phase shift (sum of phase shifts of the unit elements (1010)) of the switchable conduction path (1000A), can be provided at the frequency of operation. In particular, one or more of the number of unit elements (1010), and the capacitance C and/or the inductance L of each of the unit elements (1010), may be selected so to provide an effective quarter wavelength path (90° phase shift) at the frequency of operation for the switchable conduction path (1000A) during the ON mode of operation. A person skilled in the art would realize that there may be many possible combinations for such selection and that a same phase shift (e.g. 90° or other) may be obtained by different number of unit elements (1010) given different values of one or more of the capacitance C and/or the inductance L. More related information can be found, for example, in the above referenced U.S. Pat. Nos. 9,831,857, 9,831,869, and U.S. Patent Publication No. US-2017-0359058-A1, the disclosures of which are incorporated herein by reference in their entirety.

Figure 11A:
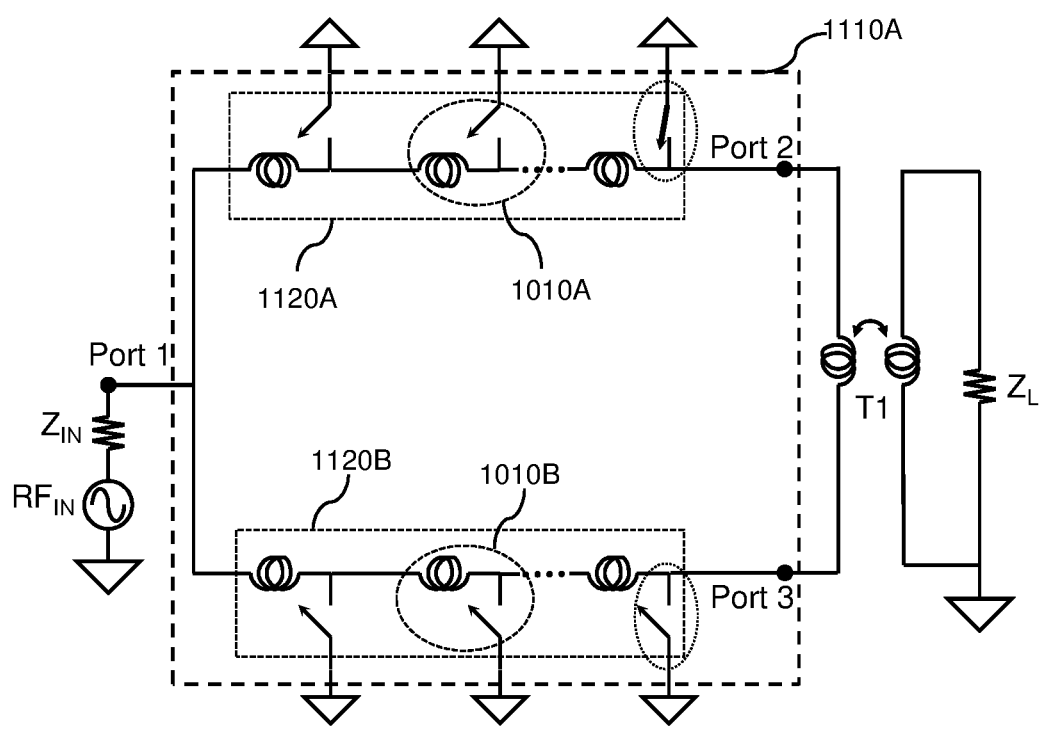
FIG. 11A shows a topology, according to an embodiment of the present disclosure, of a low loss, wide band, phase shifter utilizing a transformer and a distributed SPDT switch.

FIG. 11A shows a topology, according to an embodiment of the present disclosure, of a low loss, wide band, phase shifter (1100A) utilizing a transformer, T1, and a distributed SPDT switch (110A). As shown in FIG. 11, the distributed SPDT switch (1110A) comprises two switching conduction paths, (1120A) and (1120B), each as described in relation to FIGS. 10A-10C. The switching conduction path (1120A) couples Port1 to Port2, and the switching conduction path (1120B) coupled Port1 to Port3. Port1 and Port2 are also coupled (connected) to a respective end of a first winding of the transformer T1. As described above, each of the switching conduction paths (1120A) and (1120B) can be made to provide a quarter wavelength transmission line at a specific frequency of operation, and therefore, the shunted switch S (encircled in FIG. 11A) of the last unit element of each of the switching conduction paths (1120A) and (1120B) coupled to a respective one of the Port2 and Port3 can be used to rotate a respective phase impedance seen by Port1 through Port2 and Port3 in a manner similar to switches S22 and S23 of FIG. 4A. In other words, when the shunted switch S of the last unit element (1010A) of (1120A) is ON (switch is closed), as shown in FIG. 11A, Port1 sees a high impedance conduction path to Port2, and when the shunted switch of the last unit element (1010B) of (1120B) is OFF (switch is open), as shown in FIG. 11A, Port1 sees a low impedance conduction path to Port3. It should also be noted that as shown in FIG. 11A, each of the switching conduction paths, (1120A) and (1120B), can comprise different numbers of respective unit elements, (1010A) and (1010B), to provide the desired quarter wavelength transmission line (90°) at a specific frequency for each of the switching conduction paths.

With further reference to the phase shifter (1100A) of FIG. 11A, a person skilled in the art would clearly understand operation of the phase shifter (1100A) in view of the above description of FIG. 4A, so to provide a relative phase shift between operation according to two states (e.g. defined by opposite states of the shunted switches of the last unit elements) of the phase shifter that is equal to 180°. For example, during a first state (or mode of operation) of the phase shifter (1100A) corresponding to the shunted switch S of the last unit element (1010A) of the switching conduction path (1120A) being ON (switch is open) and the shunted switch S of the last unit element (1010B) of the switching conduction path (1120B) being OFF (switch is closed), a current signal at Port1 travels through the switching conduction path (1120A), through the first winding of the transformer T1, and to ground provided by the ON switch S of the last unit element (1010B) of the switching conduction path (1120B). As a result, a mutually induced current in antiphase (180°) is produced through the second winding of the transformer T1. During a second state of the phase shifter (1100A) corresponding to the shunted switch S of the last unit element (1010A) of the switching conduction path (1120A) being OFF and the shunted switch S of the last unit element (1010B) of the switching conduction path (1120B) being ON, a similar operation to the first state is obtained, with a difference that a direction of the current through the primary winding becomes opposite. Effectively, a phase shift of a signal at the load $Z_L$ of about 180° can be observed between operation according to the first and second states.

Figure 11B:
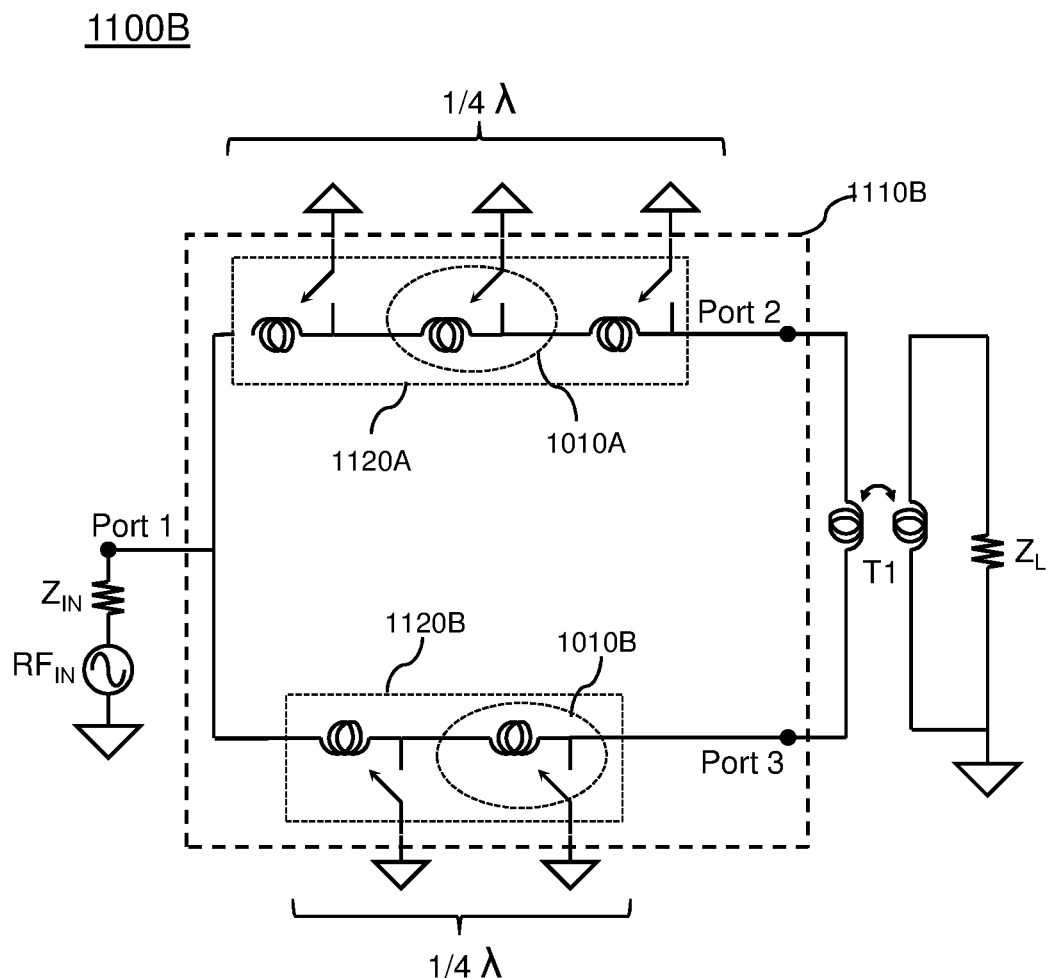
FIG. 11B shows a topology, according to an embodiment of the present disclosure, of a low loss, wide band, phase shifter utilizing a transformer and a distributed SPDT switch, wherein switching conduction paths of the distributed SPDT switch have different numbers of unit elements.

FIG. 11B shows a topology, according to an embodiment of the present disclosure, of a low loss, wide band, phase shifter (1100B) utilizing a transformer, T1, and a distributed SPDT switch (1110B). As shown in FIG. 11B, the distributed SPDT switch (1110B) comprises two switching conduction paths, (1120A) and (1120B), each as described in relation to FIGS. 10A-10C, where each of the switching conduction paths can provide a quarter wavelength transmission line using different numbers of unit element (2 and 3). As described above, transistor size and/or inductance size (e.g. length, width, height) of the transmission line TL of each of the unit elements (e.g. 1010A, 1010B) can be selected so to provide different unit characteristics (e.g. delay at a frequency of operation).

Figure 11C:
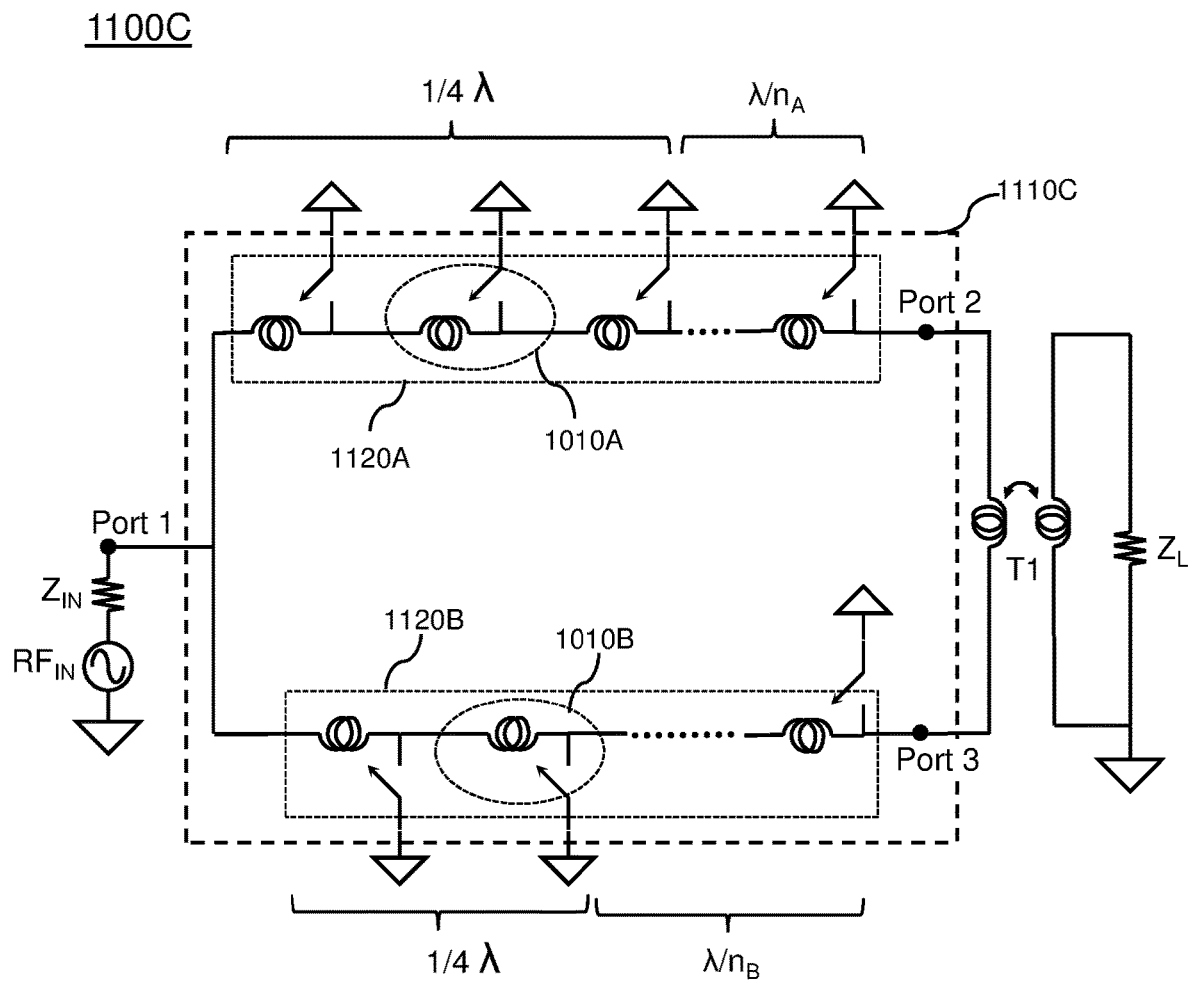
FIG. 11C shows a topology, according to an embodiment of the present disclosure, of a low loss, wide band, phase shifter utilizing a transformer and a distributed SPDT switch, wherein switching conduction paths of the distributed SPDT switch have additional numbers of unit elements to provide frequency specific phase shifts and/or frequency independent time delays.

FIG. 11C shows a topology, according to an embodiment of the present disclosure, of a low loss, wide band, phase shifter (1100C) utilizing a transformer, T1, and a distributed SPDT switch (1110C). As shown in FIG. 11C, the distributed SPDT switch (1110C) comprises two switching conduction paths, (1120A) and (1120B), which in addition to a respective number of series connected unit elements (1010A) and (1010B) for provision of a quarter wavelength transmission line, as described with respect to the topologies of FIGS. 11A and 11B, each includes additional unit elements for provision of additional frequency specific phase delays and/or frequency independent time delays. Effectively, the level shifter (1100C) of FIG. 11C can provide functionalities equivalent to the level shifters described with respect to FIGS. 8A, 8B and 8C by using a number of specifically sized unit elements (1010A) and (1010B). Such functionalities may include, for example, arbitrary phase shift at a given frequency of operation, and/or arbitrary time delay independent of a frequency of operation, between operation of the phase shifter (1100C) according to two different states. Furthermore, the distributed SPDT switch (1110C) can be operated as a tunable reflective SPDT switch in a manner similar to one described above with respect to the tunable reflective SPDT switch (810C) of FIG. 8C. Based on the above description of FIGS. 4A-4E, 8A-8C, a person skilled in the art would clearly understand such functionalities provided by the phase shifter (1100C) of FIG. 11C.

With further reference to the phase shifter (1100C) of FIG. 11C, the switching conduction paths (1120A) and (1120B) may have a different number of unit elements (1010) to respectively provide phases (¼λ+λ/$n_A$) and (¼λ+λ/$n_B$), and therefore the phase difference between operations according to the two states may be further affected by a difference in phase shift, $\Delta\Phi(A,B)=\lambda/n_A-\lambda/n_B$, provided by the two switching conduction paths (1120A) and (1120B). A person skilled in the art would understand that in general, the phase difference between operations according to the two modes of operation (states) of the phase shifter (1100C) is 180°−ΔΦ(A,B).

Figure 12:
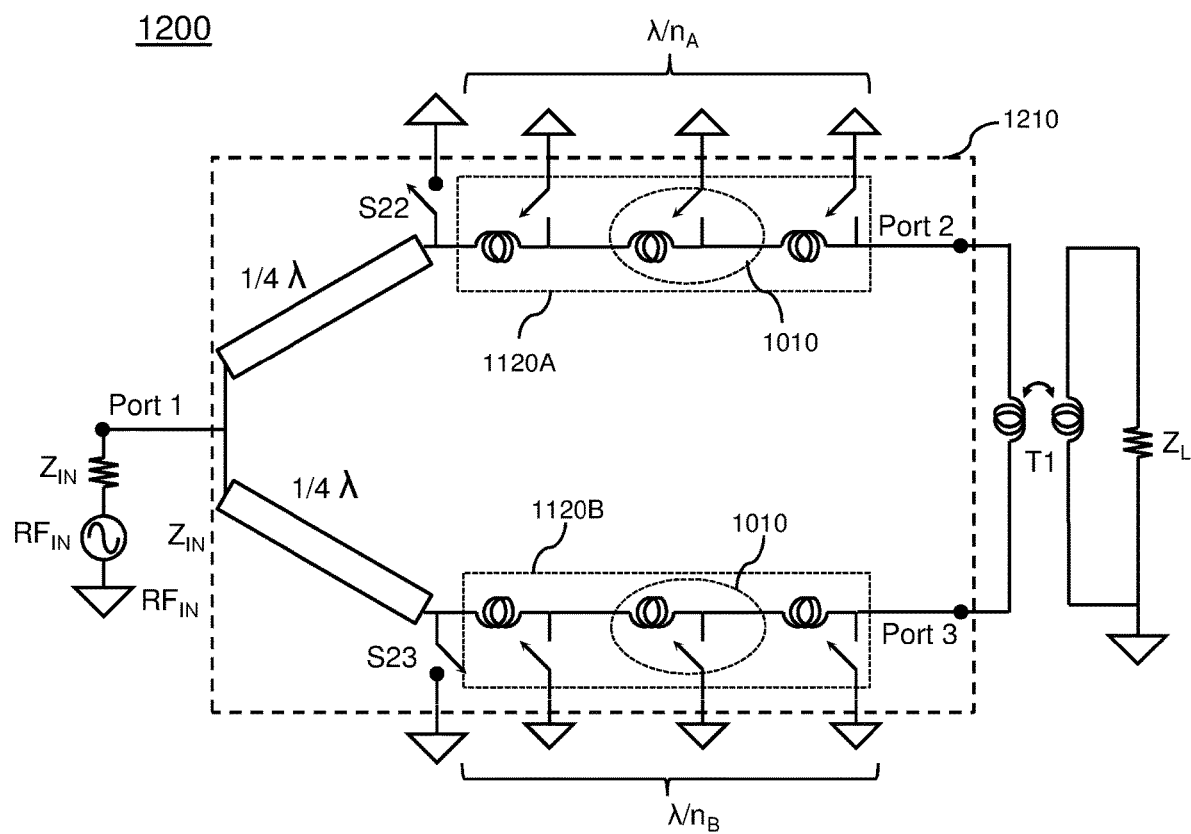
FIG. 12 shows a topology, according to an embodiment of the present disclosure, of a low loss, wide band, phase shifter utilizing a transformer and a hybrid SPDT switch (1210) that comprises a combination of a reflective SPDT switch and switchable conduction paths.

FIG. 12 shows a topology, according to an embodiment of the present disclosure, of a low loss, wide band, phase shifter (1200) utilizing a transformer, T1, and a hybrid SPDT switch (1210) that comprises a combination of a reflective SPDT switch (e.g. per FIG. 4A), to provide impedance transformation seen by Port1 through Port2 and Port3 (under control of switches S22 and S23), and switchable conduction paths, (1120A) and (1120B), respectively coupled to branches (¼λ) of the reflective SPDT switch, the switchable conduction paths (1120A) and (1120B) to provide additional frequency dependent phase delay and/or frequency independent time delay. As can be seen in FIG. 12, the switchable conduction paths (1120A) and (1120B) are based on the distributed element model described above with reference to FIG. 10A. A person skilled in the art would clearly understand operation of the phase shifter (1200) in view of at least the above description of FIGS. 4A, 8B, 8C, 10A and 11C. Furthermore, a person skilled in the art would clearly understand that any phase shifter according to the present disclosure may be implemented via branches that comprise one or more of transmission lines λ/n, per FIG. 8C, and/or distributed elements per FIG. 10A.

It should be noted that the various embodiments of the low loss, wide band, phase shifter utilizing a transformer, according to the present disclosure, may be implemented as a monolithically integrated circuit (IC) according to any fabrication technology and process known to a person skilled in the art.

The term "amplifier" as used in the present disclosure is intended to refer to amplifiers comprising single or stacked transistors configured as amplifiers, and can be used, for example, as power amplifiers (PAs) and/or low noise amplifiers (LNAs). An amplifier can refer to a device that is configured to amplify a signal input to the device to produce an output signal of greater magnitude than the magnitude of the input signal. Stacked transistor amplifiers are described for example in U.S. Pat. No. 7,248,120, issued on Jul. 24, 2007, entitled "Stacked Transistor Method and Apparatus", the disclosure of which is incorporated herein by reference in its entirety. As used herein, the term "amplifier" can also be applicable to amplifier modules and/or power amplifier modules having any number of stages (e.g., pre-driver, driver, final), as known to those skilled in the art.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

A number of embodiments according to the present disclosure have been described. It is to be understood that various modifications may be made without departing from the spirit and scope of such embodiments. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the disclosure, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A phase shifter circuit comprising:
    a first port configured to receive a radio frequency (RF) signal that is processed by the phase shifter circuit and output at a load;
    a first switchable conduction path comprising one or more series connected transmission lines, and one or more shunted switching transistors each coupled to a respective transmission line of the one or more series connected transmission lines, the first switchable conduction path configured to selectively couple the first port to a second port via one of a low impedance conduction path and a high impedance conduction path by respectively opening and closing of at least one shunted switching transistor of the one or more shunted switching transistors of the first switchable conduction path;
    a second switchable conduction path comprising one or more series connected transmission lines, and one or more shunted switching transistors each coupled to a respective transmission line of the one or more series connected transmission lines, the second switchable conduction path configured to selectively couple the first port to a third port via one of a low impedance conduction path and a high impedance conduction path by respectively opening and closing of at least one shunted switching transistor of the one or more shunted switching transistors of the second switchable conduction path; and
    a first transformer having a first winding and a second winding, the first winding coupled to the second port and the third port at a respective one of two ends of the first winding, and the second winding coupled to the load,
    wherein the phase shifter circuit is configured to operate according to at least two modes of operation, a first mode and a second mode,
    wherein in the first mode of operation, the first switchable conduction path couples the first port to the second port via the low impedance conduction path, and the second switchable conduction path couples the first port to the third port via the high impedance conduction path, and
    wherein in the second mode of operation, the first switchable conduction path couples the first port to the second port via the high impedance conduction path, and the second switchable conduction path couples the first port to the third port via the low impedance conduction path.

2. The phase shifter circuit according to claim 1, wherein:
    in the first mode of operation, the at least one shunted switching transistor of the second switchable conduction path is closed so to provide a short circuit path between a reference ground and the respective one of the two ends of the first winding coupled to the third port, therefore a first current is conducted from the first port to the reference ground at the third port through the first switching conduction path and the first winding, and in the second mode of operation, the at least one shunted switching transistor of the first switchable conduction path is closed so to provide a short circuit path between the reference ground and the respective one of the two ends of the first winding coupled to the second port, therefore a second current that is substantially equal to the first current, is conducted from the first port to the reference ground at the second port through the second switching conduction path and the first winding.

3. The phase shifter circuit according to claim 2, wherein:
the phase shifter circuit is configured to operate according to two additional modes of operation: a third mode of operation and a fourth mode of operation,
in the third mode of operation, the at least one shunted switching transistor of the first switchable conduction path and the at least one shunted switching transistor of the second switchable conduction path are open, and
in the fourth mode of operation, the at least one shunted switching transistor of the first switchable conduction path and the at least one shunted switching transistor of the second switchable conduction path are closed.

4. The phase shifter circuit according to claim 3, wherein:
in one of the first and the second modes of operation, the RF signal at the load has a reference phase and an amplitude that is substantially equal to an amplitude of the RF signal at the first port,
in the other one of the first and the second modes of operation, the RF signal at the load has a phase that is shifted with respect to the reference phase and an amplitude that is substantially equal to the amplitude of the RF signal at the first port,
in the third mode of operation, the RF signal at the load has a substantially attenuated amplitude compared to the amplitude of the RF signal at the first port, and
in the fourth mode of operation, the first port and the load are substantially electrically isolated.

5. The phase shifter circuit according to claim 2, further comprising:
a third switchable conduction path comprising one or more series connected transmission lines, and one or more shunted switching transistors each coupled to a respective transmission line of the one or more series connected transmission lines, the third switchable conduction path configured to selectively couple the first port to a fourth port via one of a low impedance conduction path and a high impedance conduction path by respectively opening and closing of at least one shunted switching transistor of the one or more shunted switching transistors of the third switchable conduction path;
a second transformer having a first winding and a second winding, said first winding coupled to the second port and the fourth port at a respective one of two ends of said first winding, and said second winding coupled to the load;
wherein in the first mode of operation, the third switchable conduction path couples the first port to the fourth port via the high impedance conduction path, and
wherein in the second mode of operation, the third switchable conduction path couples the first port and the fourth port via the low impedance conduction path.

6. The phase shifter circuit according to claim 5, wherein:
in the first mode of operation, the at least one shunted switching transistor of the third switchable conduction path is closed so to provide a short circuit path between a reference ground and the respective one of the two ends of the first winding of the second transformer coupled to the fourth port, therefore a third current is conducted from the first port to the reference ground at the fourth port through the first switching conduction path and the first winding of the second transformer, the third current being substantially equal to the first current, and
in the second mode of operation, a fourth current, that that is substantially equal to the second current, is conducted from the first port to the reference ground at the second port through the third switching conduction path and the first winding of the second transformer.

7. The phase shifter circuit according to claim 6, wherein:
the RF signal at the load is provided at a common node coupled to respective first ends of the load and of the second windings,
respective second ends of the load and of the second winding are coupled to the reference ground, and
in the first and the second modes of operation, the RF signal at the load is provided by summation into the load of two parallel currents flowing between the common node and each second winding of the first and the second transformers.

8. The phase shifter circuit according to claim 1, wherein each of the first switchable conduction path and the second switchable conduction path comprises:
a first quarter wavelength transmission line formed by a number of a respective one of the one or more series connected transmission lines, the number being based on a frequency of operation of the RF signal, the first quarter wavelength transmission line coupled to the first port at one end of the first quarter wavelength transmission line; and
a first shunted switching transistor of a respective one of the one or more shunted switching transistors coupled to a second end of said transmission line,
wherein:
when the first shunted switching transistor is closed, the first port sees a high impedance through the first quarter wavelength transmission line, and
when the first shunted switching transistor is open, the first port sees a low impedance through the first quarter wavelength transmission line.

9. The phase shifter circuit according to claim 8, wherein in the first and second modes of operation, any shunted switching transistor of the respective one of the one or more shunted switching transistors coupled to the first quarter wavelength transmission line that is different from the first shunted switching transistor, is configured to operate in an open state.

10. The phase shifter circuit according to claim 9, wherein the at least one shunted switching transistor of a respective one of the first and the second switchable conduction paths comprises all shunted switching transistors of the respective one of the one or more shunted switching transistors that are not coupled to the first quarter wavelength transmission line.

11. The phase shifter circuit according to claim 9, wherein in the first and second modes of operation, all shunted switching transistors of the respective one of the one or more shunted switching transistors that are not coupled to the first quarter wavelength transmission line are configured to operate according to a same open and closed state of the first shunted switching transistor.

12. The phase shifter circuit according to claim 11, wherein:
in the first mode of operation, the first shunted switching transistor of the first switchable conduction path is open and the first shunted switching transistor of the second switchable conduction path is closed, and
in the second mode of operation, the first shunted switching transistor of the first switchable conduction path is closed and the first shunted switching transistor of the second switchable conduction path is open.

13. The phase shifter circuit according to claim 8, wherein:
for each of the first and second switchable conduction paths, the first quarter wavelength transmission line is formed by all of the respective one or more series connected transmission lines, and
a phase difference between operation in the first and the second mode of the RF signal at the load is substantially equal to 180°.

14. The phase shifter circuit according to claim 13, wherein the number of the respective one of the one or more series connected transmission lines forming the first quarter wavelength transmission line of the first switchable conduction path is different from the number of the respective one of the one or more series connected transmission lines forming the first quarter wavelength transmission line of the second switchable conduction path.

15. The phase shifter circuit according to claim 13, wherein the number of the respective one of the one or more series connected transmission lines forming the first quarter wavelength transmission line of the first switchable conduction path is equal to the number of the respective one of the one or more series connected transmission lines forming the first quarter wavelength transmission line of the second switchable conduction path.

16. The phase shifter circuit according to claim 8, wherein:
a remaining number of the respective one of the one or more series connected transmission lines not included in forming of the first quarter wavelength transmission line is configured to provide a respective phase delay, Phase(S1), Phase(S2), at the frequency of operation of the RF signal, through a respective one of the first and the second switchable conduction paths, and
a phase difference between operation in the first and the second mode of the RF signal at the load is substantially equal to 180°−((Phase(S1)−Phase(S2)).

17. The phase shifter circuit according to claim 16, wherein the respective phase delay is provided by a combination of inductances of the remaining number of the respective one of the one or more series connected transmission lines and capacitances of associated coupled shunted switching transistors operating in their respective open states.

18. The phase shifter circuit according to claim 8, wherein:
a remaining number of the respective one of the one or more series connected transmission lines not included in forming of the first quarter wavelength transmission line is configured to provide a respective time delay, Time(S1), Time(S2), through a respective one of the first and the second switchable conduction paths.

19. The phase shifter circuit according to claim 8, wherein for at least one of the first and second switchable conduction paths, the first quarter wavelength transmission line is formed by a single quarter wavelength structure.

20. The phase shifter circuit according to claim 19, wherein the first quarter wavelength transmission line of the other of the first and second switchable conduction paths is formed by a single quarter wavelength structure.

21. The phase shifter circuit according to claim 20, wherein the first conduction path and the second conduction path form a single-pole double-throw (SPDT) switch having a quarter wavelength architecture.

22. The phase shifter circuit according claim 1, wherein for each of the first and the second switchable conduction paths, each of the one or more series connected transmission lines and a respective coupled shunted switching transistor of the one shunted switching transistors, form a unit element, the unit element comprising:
a discrete inductance value L of said transmission line; and
an OFF capacitance of said coupled shunted switching transistor,
wherein a combination of the inductance L and the OFF capacitance is configured to provide a phase shift of the RF signal at the first port through each of the first and second switchable conduction paths.

23. The phase shifter circuit according to claim 1, wherein the load is an input stage of an RF amplifier.

24. The phase shifter circuit according to claim 23, wherein the RF amplifier is a differential RF amplifier.

25. The phase shifter according to claim 24, wherein the phase shifter circuit further comprises:
the differential amplifier having a differential output;
a third port coupled to an output load configured to carry an amplified version of the RF signal received at the first port;
a third switchable conduction path comprising one or more series connected transmission lines, and one or more shunted switching transistors each coupled to a respective transmission line of the one or more series connected transmission lines, the third switchable conduction path configured to selectively couple the third port to a fourth port via one of a low impedance conduction path and a high impedance conduction path by respectively opening and closing of at least one shunted switching transistor of the one or more shunted switching transistors of the third switchable conduction path;
a fourth switchable conduction path comprising one or more series connected transmission lines, and one or more shunted switching transistors each coupled to a respective transmission line of the one or more series connected transmission lines, the fourth switchable conduction path configured to selectively couple the third port to a fifth port via one of a low impedance conduction path and a high impedance conduction path by respectively opening and closing of at least one shunted switching transistor of the one or more shunted switching transistors of the fourth switchable conduction path; and
a second transformer having a first winding and a second winding, the first winding of the second transformer coupled to the fourth port and the fifth port at a respective one of two ends of the first winding of the second transformer, and the second winding of the second transformer coupled to the differential output of the differential amplifier.

26. The phase shifter circuit according to claim 1, wherein the phase shifter circuit is monolithically integrated.

* * * * *